United States Patent
Baek

(10) Patent No.: US 12,086,365 B2
(45) Date of Patent: Sep. 10, 2024

(54) DISPLAY DEVICE AND TOUCH SENSING UNIT THEREIN

(71) Applicant: SAMSUNG DISPLAY CO., LTD., Yongin-si (KR)

(72) Inventor: Seung-ho Baek, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/311,143

(22) Filed: May 2, 2023

(65) Prior Publication Data

US 2023/0266849 A1    Aug. 24, 2023

Related U.S. Application Data

(63) Continuation of application No. 16/185,124, filed on Nov. 9, 2018, now Pat. No. 11,650,701.

(30) Foreign Application Priority Data

Dec. 27, 2017    (KR) .................... 10-2017-0181223

(51) Int. Cl.
*G06F 3/041* (2006.01)
*G06F 3/044* (2006.01)
(Continued)

(52) U.S. Cl.
CPC .......... *G06F 3/044* (2013.01); *G06F 3/04164* (2019.05); *G06F 3/04166* (2019.05); *G06F 3/0443* (2019.05); *G06F 3/0445* (2019.05); *G06F 3/0446* (2019.05); *G09G 3/20* (2013.01); *H10K 50/844* (2023.02);
(Continued)

(58) Field of Classification Search
CPC .............................................. G09G 2310/0286
See application file for complete search history.

(56) References Cited

U.S. PATENT DOCUMENTS 9,298,294 B2    3/2016  Takeuchi et al.
9,733,759 B2 *  8/2017  Sun ..................... G06F 3/04166
(Continued)

FOREIGN PATENT DOCUMENTS

CN          106293197         1/2017
KR      10-2015-0095449       8/2015
(Continued)

*Primary Examiner* — William Boddie
*Assistant Examiner* — Bipin Gyawali
(74) *Attorney, Agent, or Firm* — F. CHAU & ASSOCIATES, LLC

(57) ABSTRACT

A display device includes a base layer, a circuit element layer, a display element layer, a thin film encapsulation layer, and a touch sensing layer. The base layer includes a display area and a non-display area bordering the display area. The circuit element layer includes first driving circuits and second driving circuits disposed in the non-display area of the base layer, and a pixel driving circuit disposed in the display area of the base layer. The display element layer in the display area of the base layer includes display elements provided on the circuit element layer. The touch sensing layer includes a plurality of touch electrodes that receive a touch sensing signal from the second driving circuit to eliminate being routed to a pad area to supply touch sensing signals to the touch electrodes.

10 Claims, 17 Drawing Sheets

(51) Int. Cl.
  *G09G 3/20* (2006.01)
  *H10K 50/844* (2023.01)
  *H10K 59/122* (2023.01)
  *H10K 59/40* (2023.01)

(52) U.S. Cl.
  CPC ........... *H10K 59/122* (2023.02); *H10K 59/40* (2023.02); *G06F 3/0412* (2013.01); *G09G 2300/0408* (2013.01); *G09G 2300/0426* (2013.01); *G09G 2310/0286* (2013.01); *G09G 2310/08* (2013.01); *G09G 2354/00* (2013.01)

(56) References Cited

U.S. PATENT DOCUMENTS

| | | | |
|---|---|---|---|
| 10,168,844 B2 | 1/2019 | Kwon et al. | |
| 10,528,166 B2 | 1/2020 | Park et al. | |
| 10,890,995 B2 | 1/2021 | Lee et al. | |
| 11,592,931 B2* | 2/2023 | Kim | G06F 3/044 |
| 11,966,525 B2* | 4/2024 | Cheng | G06F 3/0412 |
| 2011/0012853 A1 | 1/2011 | Chang et al. | |
| 2011/0021853 A1 | 1/2011 | Lauritzen et al. | |
| 2012/0044168 A1 | 2/2012 | Mizuhashi et al. | |
| 2015/0227170 A1 | 8/2015 | Kim et al. | |
| 2015/0356767 A1 | 12/2015 | Abe et al. | |
| 2017/0010714 A1 | 1/2017 | Lee | |
| 2017/0149017 A1 | 5/2017 | Lee et al. | |
| 2018/0284926 A1 | 10/2018 | Kim et al. | |
| 2018/0307368 A1 | 10/2018 | Koide | |
| 2018/0366520 A1 | 12/2018 | Gwon et al. | |
| 2019/0058021 A1 | 2/2019 | Kim | |
| 2019/0064977 A1 | 2/2019 | Feng et al. | |
| 2019/0121474 A1 | 4/2019 | Lee et al. | |
| 2019/0171319 A1 | 6/2019 | Aoki et al. | |
| 2019/0178467 A1 | 6/2019 | Kim et al. | |
| 2019/0196619 A1 | 6/2019 | Baek | |
| 2019/0346987 A1* | 11/2019 | Shi | H01L 27/124 |
| 2020/0168284 A1* | 5/2020 | Yu | G06F 3/0412 |

FOREIGN PATENT DOCUMENTS

| | | |
|---|---|---|
| KR | 10-1721701 | 3/2017 |
| KR | 10-2017-0122892 | 11/2017 |
| KR | 10-2018-0112185 | 10/2018 |
| KR | 10-2019-0008491 | 1/2019 |

* cited by examiner

DISPLAY DEVICE AND TOUCH SENSING UNIT THEREIN

CROSS-REFERENCE TO RELATED APPLICATIONS

This U.S. non-provisional patent application is a continuation of U.S. patent application Ser. No. 16/185,124, filed on Nov. 9, 2018 in the U.S. Patent and Trademark Office, which claims priority under 35 U.S.C. § 119 from Korean Patent Application No. 10-2017-0181223, filed on Dec. 27, 2017 in the Korean Intellectual; Property Office, the entire contents of both of which are incorporated by reference herein.

TECHNICAL FIELD

Embodiments of the inventive concept relate to a display device with a touch sensing unit integrated therein. More particularly, the embodiments of the inventive concept are directed to a display device with circuitry arranged to maintain or reduce a bezel width of a display device having a touch line in a non-display area.

DISCUSSION OF THE RELATED ART

Various types of display devices used for multi-media devices such as, for example, televisions, mobile phones, tablet computers, navigations, and game consoles, are being developed. A keyboard or a mouse may be included as an input device of a display device. More recent display devices may include a touch sensor as an input device, and the touch sensor may be provided in addition to, or in place of, for example, a mouse.

Depending on the structure, the touch sensor of the display device may be categorized into an add-on type, an on-cell type, an integrated type or an in-cell type. The add-on type of touch sensor is a category where the display device and a touch panel with a touch sensor is separately manufactured, and the touch panel is attached to the top surface of the display device. The on-cell type is a touch sensor directly formed on the top surface of a display device. The integrated type is a touch sensor embedded inside a display device.

In the case of on-cell type and integrated type touch sensors, wiring and pads utilized for the touch sensor are generally formed on a base layer of a display panel. However forming the wiring and pads on the base layer of the display panel may increase the width (e.g., a bezel width) of a non-display area of the display panel.

SUMMARY

Embodiments of the inventive concept may reduce the number of wirings connected to a touch sensing unit in a display device having the touch sensing unit integrated therein to prevent an increase in a width of a bezel.

An embodiment of the inventive concept provides a display device including: a base layer including a display area and a non-display area disposed outside the display area; a circuit element layer including a first driving circuit and a second driving circuit disposed in the non-display area of the base layer, and a pixel driving circuit disposed in the display area of the base layer and configured to receive a driving signal from the first driving circuit layer; a display element layer disposed in the display area of the base layer and including display elements provided on the circuit element layer; a thin film encapsulation layer configured to cover the display element layer in the display area and cover the first and second driving circuits in the non-display area; and a touch sensing layer including a plurality of touch electrodes and configured to receive a touch sensing signal from the second driving circuit.

In an embodiment of the inventive concept, the plurality of touch electrodes may include: a plurality of first touch electrodes arranged in a first direction; and a plurality of second touch electrodes arranged in a second direction substantially perpendicular to the first direction. The arrangement of the plurality of touch electrodes in the first direction and in the second direction substantially perpendicular to the first direction may be a matrix form.

In an embodiment of the inventive concept, the second driving circuit may include a second shift register for sequentially outputting the touch sensing signal, and the touch sensing layer may further include a plurality of sensing signal lines for supplying the touch sensing signal outputted from the second shift register to the first touch electrodes.

In an embodiment of the inventive concept, the second shift register may include a plurality of stages arranged in the first direction and sequentially driven in the first direction, and the plurality of stages may be connected to the sensing signal lines, respectively.

In an embodiment of the inventive concept, the touch sensing layer may further include read-out lines connected to first ends of the second touch electrodes, respectively, to read out signals from the second touch electrodes.

In an embodiment of the inventive concept, the touch sensing layer may include: first read-out lines connected to one ends of the second touch electrodes, respectively, to read out signals from the second touch electrodes; and second read-out lines connected to the other ends of the second touch electrodes, respectively, to read out signals from the second touch electrodes.

In an embodiment, of the inventive concept the second driving circuit may further include a second control signal line for supplying a second control signal for driving the second shift register to the second shift register.

In an embodiment of the inventive concept, the first driving circuit may include: a first shift register configured to sequentially output and supply the scan signals to the pixel driving circuit; and a first control signal line configured to supply a first control signal for driving the first shift register to the first shift register.

In an embodiment of the inventive concept, the second shift register may be connected to the first control signal line and receive a second control signal for driving the second shift register through the first control signal line, and the first shift register and the second shift register may operate alternately.

In an embodiment of the inventive concept, the display area may have a rectangular shape defined by the first direction and the second direction, and the display device may further include a dam part formed in a rectangular closed loop shape to surround the display area.

In an embodiment of the inventive concept, the first driving circuit may be disposed inside a rectangular closed loop area defined by the dam part and the second driving circuit may be disposed outside the rectangular closed loop area defined by the dam part.

In an embodiment of the inventive concept, the first driving circuits and the second driving circuits may be provided substantially parallel to the first direction.

In an embodiment of the inventive concept, the first driving circuits may be provided substantially parallel to the first direction, and the second driving circuits may be provided substantially parallel to the second direction.

In an embodiment of the inventive concept, a portion of the second driving circuit may overlap the dam part.

In an embodiment of the inventive concept, a display device includes: a base layer including a display area and a non-display area bordering at least a portion of the display area; a circuit element layer including a first driving circuit and a second driving circuit disposed in the non-display area of the base layer, a pixel driving circuit disposed in the display area of the base layer and configured to receive a scan signal from the first driving circuit layer, and a switching circuit configured to receive a switching signal from the second driving circuit; a display element layer disposed in the display area of the base layer and including display elements provided on the circuit element layer; a thin film encapsulation layer that covers the display element layer in the display area and covers the first driving circuit and the second driving circuit in the non-display area; and a touch sensing layer including a plurality of touch electrodes, sensing signal lines drawn from the touch electrodes, respectively, and common signal lines connected to the sensing signal lines through the switching circuit.

In an embodiment of the inventive concept, a plurality of signal pads is disposed in a pad area of the non-display area are connected to ends of the sensing signal lines, and the first touch electrodes receive touch signals through the second driving circuit.

In an embodiment of the inventive concept, the plurality of touch electrodes may be arranged in a row direction and a column direction, and the switching circuit may include switching units positioned for each row, and the sensing signal lines drawn from the touch electrodes of each row may be connected to common signal lines through corresponding switch units.

In an embodiment of the inventive concept, the second driving circuit may include a second shift register that sequentially outputs the switching signal, and the switching units of the switching circuit may be sequentially turned on in response to the switching signal.

In an embodiment of the inventive concept, the second driving circuit may further include a second control signal line that provides a second control signal to the second shift register so that the second shift register is driven.

In an embodiment of the inventive concept, the first driving circuit may include: a first shift register configured to sequentially output and supply the scan signals to the pixel driving circuit; and a first control signal line configured to supply a first control signal for driving the first shift register to the first shift register.

In an embodiment of the inventive concept, the second shift register may be connected to the first control signal line and receive a second control signal for driving the second shift register through the first control signal line, and the first shift register and the second shift register may operate alternately.

In an embodiment of the inventive concept, a plurality of signal pads are disposed in a pad area of the non-display area that are connected to ends of the plurality of sensing signal lines, and the plurality of touch electrodes receive touch signals through the second driving circuit;

BRIEF DESCRIPTION OF THE DRAWINGS

The accompanying drawings are included to provide a fuller understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
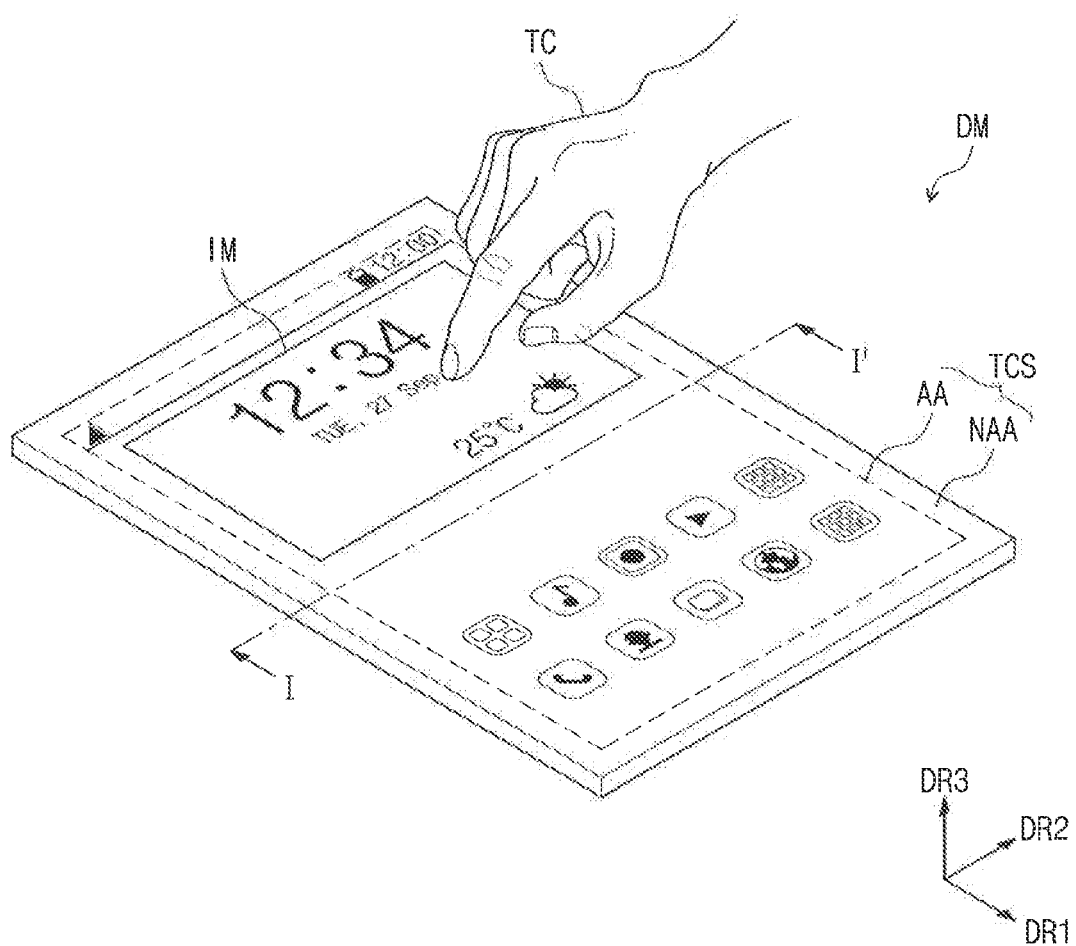
FIG. 1 is a perspective view of a display module according to an exemplary embodiment of the inventive concept.

Hereinafter, some embodiments of the inventive concept will be described with reference to the drawings. In this specification, when it is mentioned that a component (or, an area, a layer, a part, etc.) is referred to as being "on", "connected to" or "combined to" another component, a person of ordinary skill in the art should understand these terms as the component may be directly on, connected to, or combined to the other component or a third component therebetween may be present.

Like reference numerals refer to like elements. Additionally, in the drawings, the thicknesses, proportions, and dimensions of components are exaggerated for effective description. The term "and/or" includes all of one or more combinations defined by related components.

A person of ordinary skill in the art should understand that the terms "first" and "second" are used herein to describe various components, but these components should not be limited by these terms. The above terms are used only to distinguish one component from another. For example, a first component may be referred to as a second component and vice versa without departing from the scope of the inventive concept and the appended claims. In addition, singular expressions may include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

In various embodiments of the inventive concept, the terms "include," "comprise," "including," or "comprising," may specify a property, a region, a fixed number, a step, a process, an element and/or a component but does not exclude other properties, regions, fixed numbers, steps, processes, elements and/or components.

FIG. 1 is a perspective view schematically illustrating a display device according to an exemplary embodiment of the inventive concept.

Referring to FIG. 1, a display device DM may be a touch screen device. The touch screen device may be, for example, a smartphone, a tablet personal computer, a mobile phone, an e-book reader, a notebook, a personal digital assistant (PDA), a portable multimedia player (PMP), an MP3 player, a mobile medical device, a camera, and/or a wearable display device, just to name some non-limiting examples.

The display device DM provides a touch screen surface TCS. The touch screen surface TCS is the outermost surface of the display device DM, and is exposed to the exterior of the display device to provide an image to a user, and is a target surface of an external touch input TC as shown in FIG. 1. The display device may include, for example, an organic light emitting display panel or a quantum dot light emitting display panel.

The touch screen surface TCS may be divided into an active area AA and a non-active area NAA on a plane. The touch screen surface TCS shown is unequally divided, as most of the touch surface screen TCS within the active area AA. The active area AA of the touch screen surface TCS displays the image IM to provide information to the user or to communicate with the user. In addition, the active area AA of the touch screen surface TCS may sense the external input TC. In the embodiment of the inventive concept shown in FIG. 1, the external input TC is illustratively the user's hand, but it is not limited thereto and may be a stylus pen or a hovering input depending on the sensing element included in the display device DM.

The non-active area NAA of the touch screen surface TCS does not display the image IM and may not detect the external input TC. However, due to the pixel arrangement of the display panel of the display device DM and the electrode structure of the touch sensing unit, the display device DM may sense the external input TC in a part of the non-active area NAA adjacent to the active area AA.

The non-active area NAA of the touch screen surface TCS may be a signal line for providing an externally applied signal to the active area AA or an area overlapping the driving elements for driving the active area AA.

In this embodiment of the inventive concept, the non-active area NAA of the touch screen surface TCS is shown in FIG. 1 as a frame shape surrounding the active area AA along a perimeter of the display, but embodiments of the inventive concept are not limited thereto, and the non-active area NAA may be set to have various shapes. For example, the non-active area NAA may be omitted, in whole or in part.

The appearance of the display device DM may have various shapes, but in an embodiment of the inventive concept, the display device DM may be substantially rectangular, having a short side extending in a first direction DR1 and a long side extending in a second direction DR2. The thickness direction of the display device DM may be defined as a third direction DR3.

Figure 2:
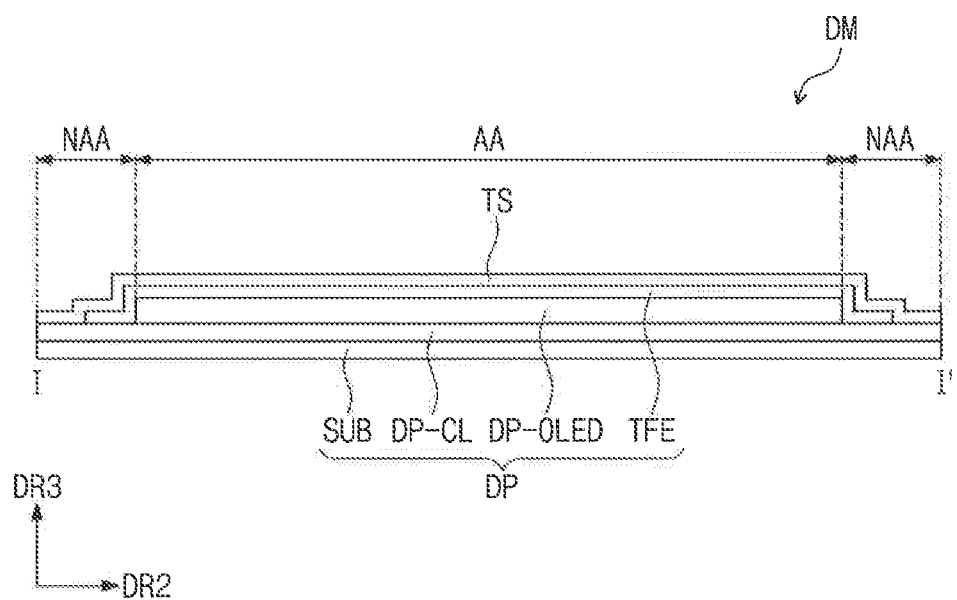
FIG. 2 is a cross-sectional view of a display device taken along the line I-I' shown in FIG. 1.

FIG. 2 is a cross-sectional view of a display device taken along the line I-I' shown in FIG. 1.

As shown in FIG. 2, the display device DM includes a display panel DP and a touch sensing unit (TS, or touch sensing layer). Although not shown separately, the display device DM according to an embodiment of the inventive concept may further include one or more of: a protection member disposed on the lower surface of the display panel DP, an anti-reflection member and/or a window member disposed on the upper surface of the touch sensing unit TS.

The display panel DP may be a light-emitting display panel, and a person of ordinary skill in the art should understand that the display panel DP is not particularly limited to one type of construction. For example, the display panel DP may be an organic light emitting display panel or a quantum dot light emitting display panel. In the organic light emitting display panel, the light emitting layer includes an organic light emitting material. In relation to the quantum dot light emitting display panel, the light emitting layer may include a plurality of quantum dots and quantum rods. Hereinafter, the display panel DP is described as an organic light emitting display panel.

The display panel DP may include, for example, a base layer SUB, a circuit element layer DP-CL disposed on the base layer SUB, a display element layer DP-OLED, and a thin film encapsulation layer TFE. Although not shown separately, the display panel DP may further include functional layers such as an antireflection layer, a refractive index control layer, and so on.

In FIG. 2, for convenience of description, the area where the display element layer DP-OLED of the display panel DP is formed, and the area where the display element layer DP-OLED is not formed, correspond to the active area AA and the non-active area NAA, but the embodiments of the inventive concept are not limited thereto. For example, the non-active area NAA may be an area defined as being outside of the display element layer DP-OLED. In another example, the non-active area NAA may be an area defined as partially overlapping the display element layer DP-OLED.

The base layer SUB may include at least one plastic film. The base layer SUB may include, for example, a plastic substrate, a glass substrate, a metal substrate, or an organic/inorganic composite material substrate as a flexible substrate. The active area AA and the non-active area NAA described with reference to FIG. 1 may be equally defined in the base layer SUB. The active area AA and the non-active area NAA are not partitioned in the base layer SUB. The active area AA and the non-active area NAA are defined in the display device DM according to the characteristics and positions of the various layers provided on the base layer SUB. Herein, an explanation will be provided with regard to the positions of the various layers formed on the base layer SUB, in which the active area AA and the non-active area NAA are defined on the base layer SUB when these areas correspond to the base layer SUB.

With continued reference to FIG. 2, the circuit element layer DP-CL includes at least one intermediate insulating layer, signal lines, circuit elements, and the like. The intermediate insulating layer includes at least one intermediate inorganic film and at least one intermediate organic film. The circuit element layer DP-CL may be disposed in the active area AA and may include signal lines and driving elements for driving the display element layer DP-OLED. In addition, the circuit element layer DP-CL is disposed in the non-active area NAA and includes first and second driving circuits for supplying signals to the signal lines and the touch sensing unit TS. The circuit element layer DP-CL will be described in detail hereinafter.

The display element layer DP-OLED includes at least organic light emitting diodes. The display element layer DP-OLED may further include an organic film such as a pixel definition film.

A thin-film encapsulation layer TFE seals the display element layer DP-OLED. The thin-film encapsulation layer TFE includes at least one inorganic layer (hereinafter referred to as an "encapsulation inorganic layer"). The thin-film encapsulation layer TFE may further include at least one organic layer (hereinafter referred to as an "encapsulation organic layer"). The encapsulation inorganic film protects the display element layer DP-OLED from moisture/oxygen, and the encapsulation organic film protects the display element layer DP-OLED from foreign substances such as dust particles. The encapsulation inorganic layer may include a silicon nitride layer, a silicon oxynitride layer, and a silicon oxide layer, a titanium oxide layer, or an aluminum oxide layer. The encapsulation organic layer may include an acryl-based organic layer, but the encapsulation organic layer is not limited to the aforementioned construction. Moreover, in another embodiment of the inventive concept, the thin-film encapsulation layer TFE may have a structure in which a first encapsulation inorganic film, an encapsulation organic layer, and a second encapsulation inorganic film are sequentially stacked. An encapsulation layer may be additionally attached on the second encapsulation inorganic layer through an adhesive material or the like.

The touch sensing unit TS obtains coordinate information from an external input. The touch sensing unit TS is directly disposed on the organic light emitting display panel DP. In this specification, a person of ordinary skill in the art should appreciated that the term "directly disposed" is defined as "being formed" through a continuous process, excluding "attached" through an additional adhesive layer.

The touch sensing unit TS may have a multi-layer structure. The touch sensing unit TS may include a single layer, or a multilayer conductive layer. The touch sensing unit TS may include a single insulating layer, or a multilayer insulating layer.

The touch sensing unit TS, for example, may sense an external input in a capacitive manner. However, the operation of the touch sensing unit TS is not limited thereto. For example, in an embodiment of the inventive concept, the touch sensing unit TS may sense an external input through an electromagnetic induction method, a pressure detection method, an infrared IR detection method, or a resistance touch detection method. The touch sensing unit TS, for example, may sense an external input by sensing a change in capacitance of the touch screen surface TCS.

Figure 3:
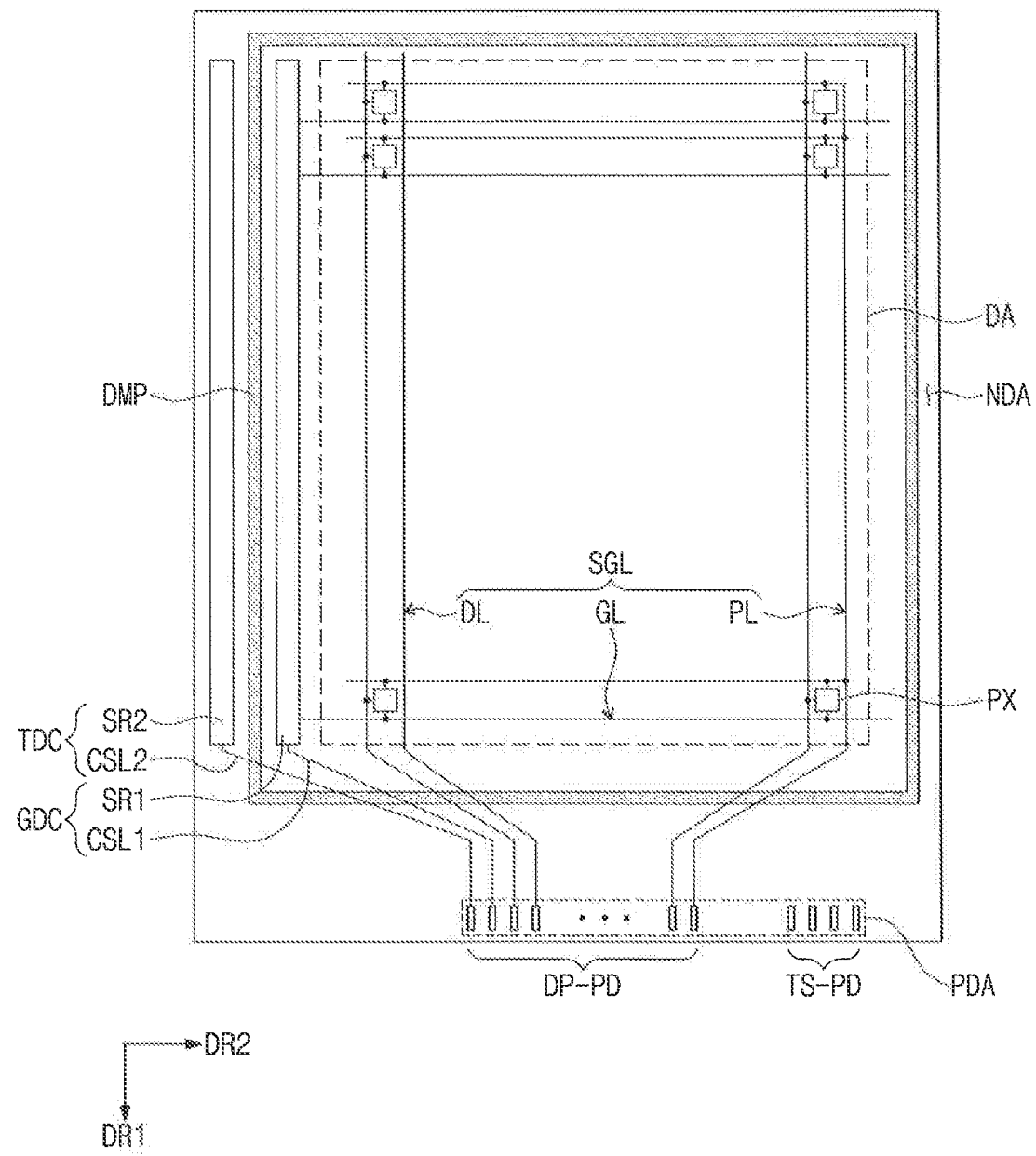
FIG. 3 is a plan view of a display panel according to an exemplary embodiment of the inventive concept.
Figure 4:
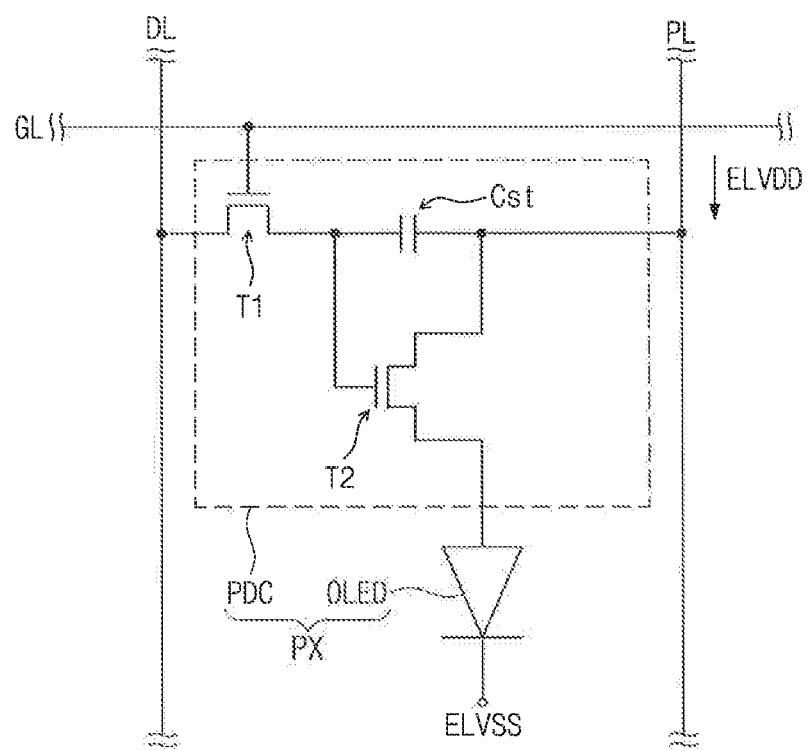
FIG. 4 is an equivalent circuit diagram of a pixel according to an exemplary embodiment of the inventive concept.
Figure 5:
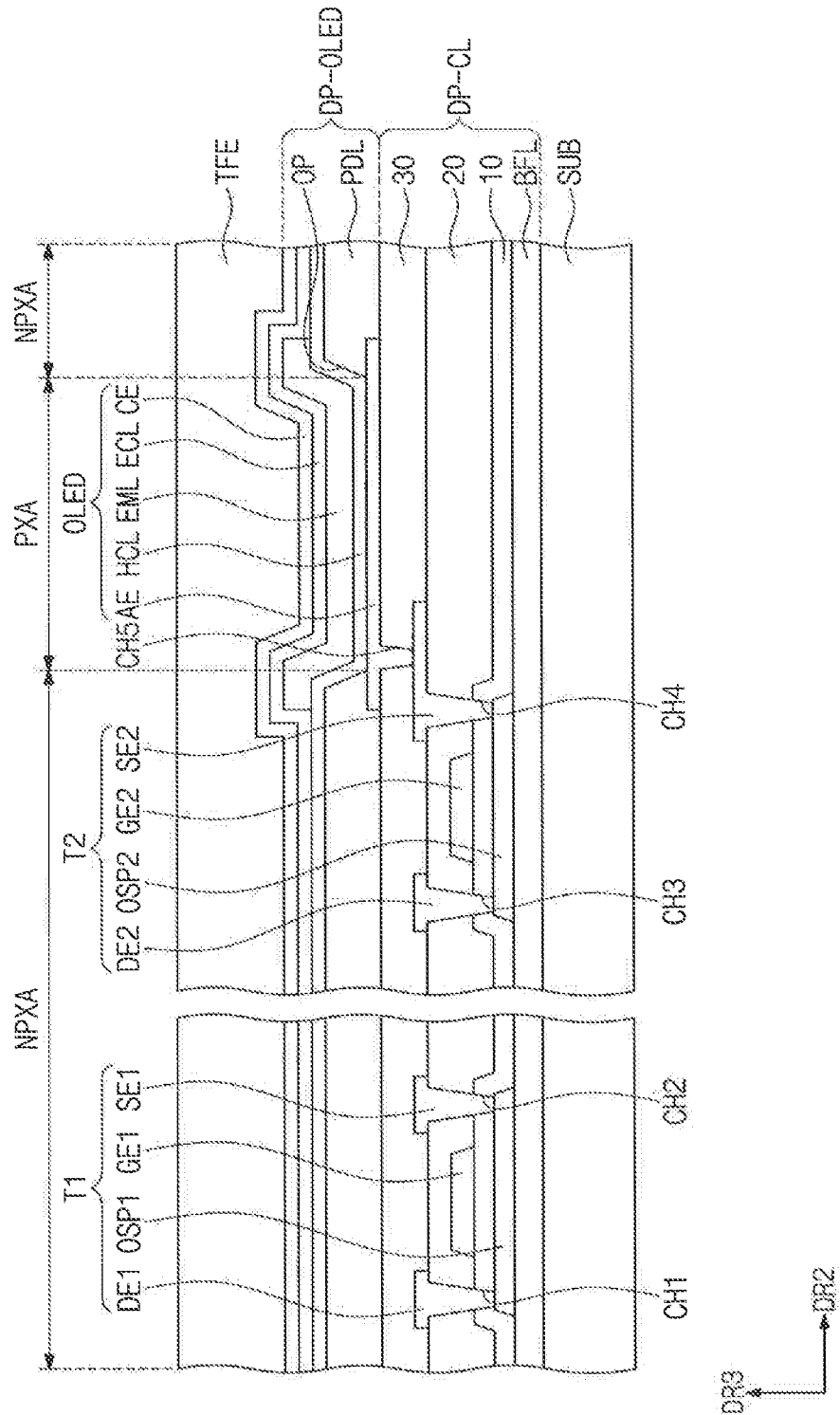
FIG. 5 is an enlarged cross-sectional view of a pixel of a display panel according to an exemplary embodiment of the inventive concept.

FIG. 3 is a plan view of a display panel DP according to an embodiment of the inventive concept. FIG. 4 is an equivalent circuit diagram of a pixel PX according to an embodiment of the inventive concept. FIG. 5 is an enlarged cross-sectional view of a display panel DP according to an embodiment of the inventive concept.

As shown in FIGS. 3 and 4, the display panel DP includes a display area DA and a non-display area NDA on a plane. In this embodiment of the inventive concept, the non-display area NDA may be bordered along the outline of the display area DA. In this embodiment of the inventive concept, the display area DA and the non-display area NDA of the display panel DP correspond to the active area AA and the non-active area NAA of the display device DM shown in FIG. 1. However, the display area DA and the non-display area NDA of the display panel DP may not necessarily correspond to the active area AA and the non-active area NAA of the display device DM, and may be changed according to structure/design of the display panel DP.

The display panel DP may include a first driving circuit GDC, a second driving circuit TDC, a plurality of signal lines SGL, and a plurality of pixels PX. The plurality of pixels PX is arranged in the display area DA. Each of the plurality of pixels PX includes an organic light emitting diode OLED and a pixel driving circuit PDC connected thereto. The first driving circuit GDC, the second driving circuit TDC, the plurality of signal lines SGL, and the pixel driving circuit PDC may be included in the circuit element layer DP-CL shown in FIG. 2.

The first driving circuit GDC may include, for example, a first shift register SR1 and a first control signal line CSL1. The first shift register SR1 includes a plurality of stages for generating a plurality of scan signals, respectively, and sequentially outputs a plurality of scan signals to a plurality of scan lines GL described hereinafter. The first control signal line CSL1 may provide first control signals to the first shift register SR1. Although not shown in the drawing, the first control signal line CSL1 may extend in the first direction DR1 along the first shift register SR1, and supply the first control signals to the plurality of stages.

In another embodiment of the inventive concept, the first driving circuit GDC may further output another control signal to the pixel driving circuit PDC.

The second driving circuit TDC may include a second shift register SR2 and a second control signal line CSL2. The second shift register SR2 includes a plurality of stages each for generating a plurality of touch sensing signals, and sequentially outputs a plurality of touch sensing signals to sensing signal lines (not shown) of the touch sensing unit TS to be described hereinafter. The second control signal line CSL2 may provide second control signals to the second shift register SR2. Although not shown in the drawing, the second control signal line CSL2 may extend in the first direction DR1 along the second shift register SR2, and supply the second control signals to the plurality of stages.

The first and second driving circuits GDC and TDC may include a plurality of thin film transistors formed through the same process as the pixel driving circuit PDC, for example, by a low-temperature polycrystalline silicon (LTPS) process or a low-temperature polycrystalline oxide (LTPO) process. It is within the embodiments of the inventive concept that the thin film transistors may be formed by another process than the pixel driving circuit PDC, but a formation through a similar process will provide a similarity in the constructive materials.

The plurality of signal lines SGL includes scan lines GL, data lines DL, and a power supply line PL. The scan lines GL are respectively connected to corresponding pixels from among the plurality of pixels PX, and the data lines DL are respectively connected to corresponding pixels among the plurality of pixels PX. The power line PL is connected to the plurality of pixels PX.

The display panel DP includes signal pads DP-PD that are connected to the ends of the signal lines SGL. The signal pads DP-PD may be included in the circuit element layer DP-CL of FIG. 2 as a type of circuit element. The area where the signal pads DP-PD are disposed in the non-display area NDA is defined as the pad area PDA. The signal pads DP-PD may include pads formed at the ends of the first and second control signal lines CSL1 and CSL2. The pad area PDA may also be provided with touch pads TS-PD connected to read-out lines (not shown) described later.

The display panel DP may include a dam part DMP. The dam part DMP may extend along the rim of the display area DA. The dam part DMP may surround the display area DA. A portion of the dam part DMP may be arranged substantially parallel to the pad area NDA-PD. In addition, the dam part DMP on one side of the four sides of the display area DA adjacent to the first driving circuit GDC is disposed outside the first driving circuit GDC and inside the second driving circuit TDC. For example, the dam part DMP may be disposed between the first and second driving circuits GDC and TDC in a plan view.

FIG. 4 exemplarily shows a pixel PX connected to any one scan line GL of the plurality of scan lines, any one data line DL, and a power line PL. A configuration of the pixel PX is not limited thereto and may be modified and implemented other than shown and described with regard to FIG. 4.

The organic light emitting diode OLED may be, for example, a front surface light-emitting type diode or a back surface light-emitting type diode. The pixel PX includes a first transistor T1 (e.g., a switching transistor), a second transistor T2 (e.g., a driving transistor), and a capacitor Cst as the pixel driving circuit PDC for driving the organic light emitting diode OLED. A first power voltage ELVDD is supplied to the second transistor T2 and a second power voltage ELVSS is supplied to the organic light emitting diode OLED. The second power voltage ELVSS may have, for example, a lower voltage level than the first power voltage ELVDD.

The first transistor T1 outputs a data signal applied to the data line DL in response to a scan signal applied to the scan line GL. The capacitor Cst charges a voltage corresponding to a data signal received from the first transistor T1.

The second transistor T2 is connected to the organic light emitting diode OLED. The second transistor T2 controls a driving current flowing through the organic light emitting diode OLED in correspondence to a charge amount stored in the capacitor Cst. The organic light emitting device OLED may emit light during a turn-on section of the second transistor T2.

In FIG. 4, the structure in which the pixel driving circuit PDC includes two transistors T1 and T2 and one capacitor Cst is shown, but the configuration of the pixel driving circuit PDC is not limited thereto.

FIG. 5 shows a partial cross-sectional view of a display panel DP corresponding to the equivalent circuit shown in FIG. 4. A circuit element layer DP-CL, a display element layer DP-OLED, and a thin film encapsulation layer TFE are sequentially arranged on the base layer SUB.

The circuit element layer DP-CL includes at least one inorganic layer, at least one organic layer, and a circuit element. The circuit element layer DP-CL may include a buffer layer BFL, a first intermediate inorganic layer 10, and a second intermediate inorganic layer 20, which are inorganic layers, and an intermediate organic layer 30 that is an organic layer.

The first inorganic layer 10 and the second inorganic layer 20 may include silicon nitride, silicon oxynitride, silicon oxide, and the like. The organic layer may include at least one of acrylic resin, methacrylic resin, polyisoprene, vinyl resin, epoxy resin, urethane resin, cellulose resin, siloxane-based resin, polyimide-based resin, polyamide-based resin, and perylene resin. The circuit element layer DP-CL includes conductive patterns and/or semiconductor patterns.

The buffer layer BFL improves the bonding strength between the base layer SUB and the conductive patterns or the semiconductor patterns. Although not shown separately in the drawing, a barrier layer for preventing a foreign material from entering may be further disposed on an upper surface of the base layer SUB. The buffer layer BFL and the barrier layer may be selectively disposed/omitted.

A semiconductor pattern OSP1 (hereinafter referred to as a first semiconductor pattern) of the first transistor T1 and a semiconductor pattern OSP2 (hereinafter referred to as a second semiconductor pattern) of the second transistor T2 are disposed on the buffer layer BFL. The first semiconductor pattern OSP1 and the second semiconductor pattern OSP2 may be selected from amorphous silicon, polysilicon, and metal oxide semiconductors.

The first intermediate inorganic layer 10 is disposed on the first semiconductor pattern OSP1 and the second semiconductor pattern OSP2. A control electrode GE1 (hereinafter referred to as a first control electrode) of the first transistor T1 and a control electrode GE2 (hereinafter referred to as a second control electrode) of the second transistor T2 are disposed on the first intermediate inorganic film 10. The first control electrode GE1 and the second control electrode GE2 may be manufactured according to the same photolithography process as the scan lines GL (see FIG. 4).

With continued reference to FIG. 5, a second intermediate inorganic layer 20 covering the first control electrode GE1 and the second control electrode GE2 is disposed on the first intermediate inorganic layer 10. An input electrode DE1 (hereinafter "a first input electrode") and an output electrode SE1 (hereinafter "a first output electrode") of the first transistor T1 and an input electrode DE2 (hereinafter "a second input electrode") and an output electrode SE2 (hereinafter "a second output electrode") of the second transistor T2 are arranged on the second intermediate inorganic layer 20.

The first input electrode DE1 and the first output electrode SE1 are connected to the first semiconductor pattern OSP1 through first and second through-holes CH1 and CH2, which pass through the first and second intermediate inorganic layers 10 and 20. The second input electrode DE2 and the second output electrode SE2 are connected to the second semiconductor pattern OSP2 through third and fourth through-holes CH3 and CH4, which pass through the first and second intermediate inorganic layers 10 and 20. On the other hand, according to another exemplary embodiment of the inventive concept, some of the first transistor T1 and the second transistor T2 may be modified as a bottom gate structure and implemented.

The intermediate organic layer 30 covering the first input electrode DE1, the second input electrode DE2, the first output electrode SE1, and the second output electrode SE2 is formed on the second intermediate inorganic layer 20. The intermediate organic layer 30 may provide a planation surface.

The display element layer DP-OLED is disposed on the intermediate organic layer 30. The display element layer DP-OLED may include a pixel definition layer PDL and an organic light emitting diode OLED. The pixel definition layer PDL may include an organic material such as the intermediate organic layer 30. A first electrode AE is disposed on the intermediate organic layer 30. The first electrode AE is connected to the second output electrode SE2 through a fifth through-hole CH5 passing through the intermediate organic layer 30. An opening OP is defined in the pixel definition layer PDL. The opening OP of the pixel definition layer PDL exposes at least a portion of the first electrode AE.

The pixel PX may be disposed in a pixel area on a plane. The pixel area may include an emission area PXA and a non-emission area NPXA adjacent to the emission area PXA. The non-emission area NPXA may surround the emission area PXA. According to this embodiment, the emission area PXA is defined corresponding to a partial area of the first electrode AE exposed by the opening part OP.

A hole control layer HCL may be commonly disposed in the emission area PXA and the non-emission area NPXA. Although not shown in the drawing separately, a common layer such as the hole control layer HCL may be commonly formed in the plurality of pixels PX (see FIG. 3).

An emission layer EML is disposed on the hole control layer HCL. The emission layer EML may be disposed in an area corresponding to the opening part OP. That is, the emission layer EML may be divided and formed at each of the plurality of pixels PX. The emission layer EML may include an organic material and/or an inorganic material. Although the patterned emission layer EML is shown exemplarily according to this embodiment, the emission layer EML may be commonly disposed in the plurality of pixels PX. At this point, the emission layer EML may generate white light. Additionally, the emission layer EML may have a multilayer structure.

An electronic control layer ECL is disposed on the emission layer EML. Although not shown in the drawing separately, the electronic control layer ECL may be commonly formed at the plurality of pixels PX (see FIG. 3).

The second electrode CE is disposed on the electronic control layer ECL. The second electrode CE is commonly disposed at the plurality of pixels PX.

The thin film encapsulation layer TFE is disposed on the second electrode CE. The thin film encapsulation layer TFE is commonly disposed at the plurality of pixels PX. According to this embodiment, the thin film encapsulation layer TFE directly covers the second electrode CE. In one embodiment of the inventive concept, a capping layer covering the second electrode CE may be further disposed between the thin film encapsulation layer TFE and the second electrode CE. At this time, a thin film encapsulation layer TFE may directly cover the capping layer.

Figure 6:
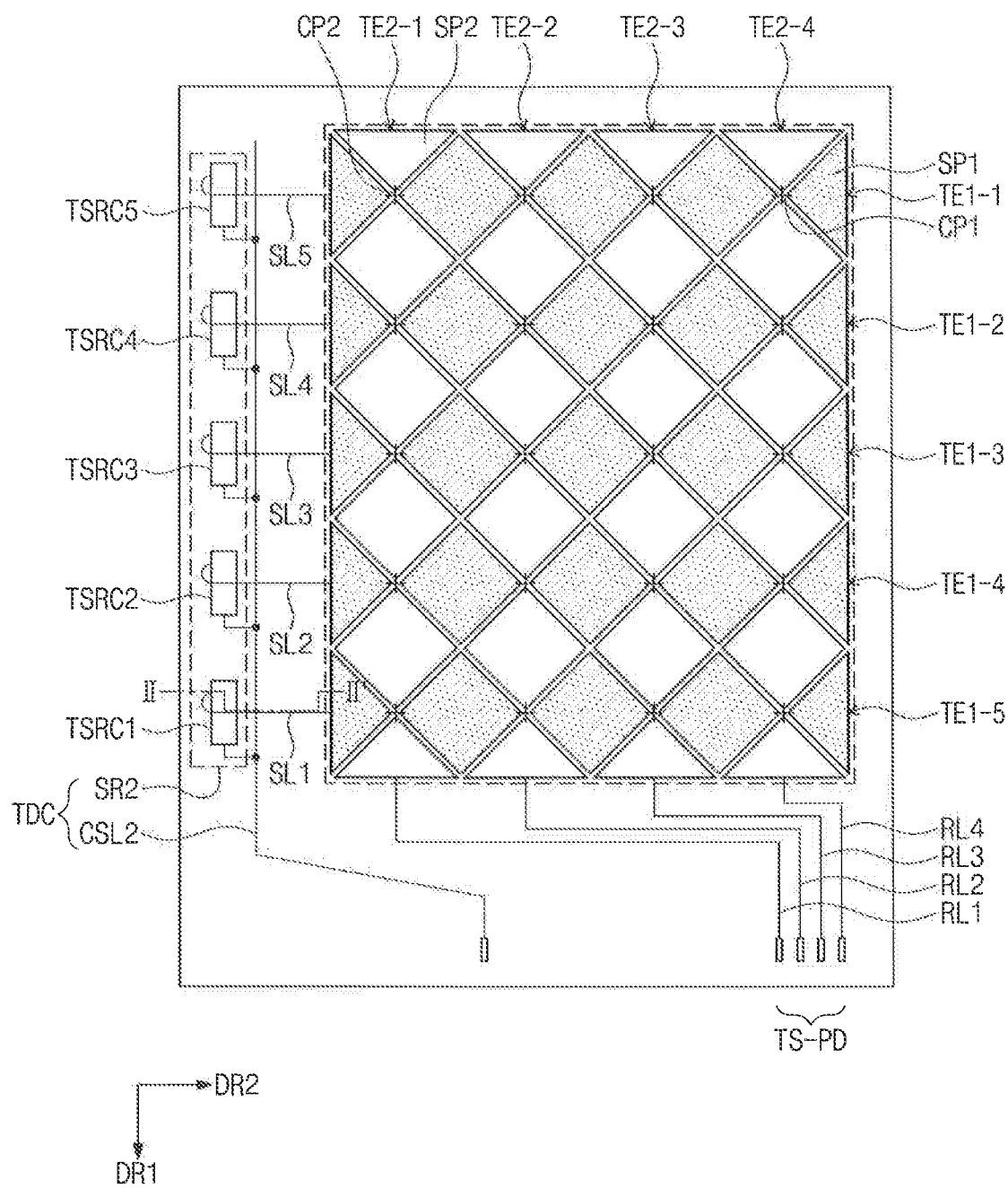
FIG. 6 is a plan view of a touch sensing unit according to an exemplary embodiment of the inventive concept.
Figure 7:
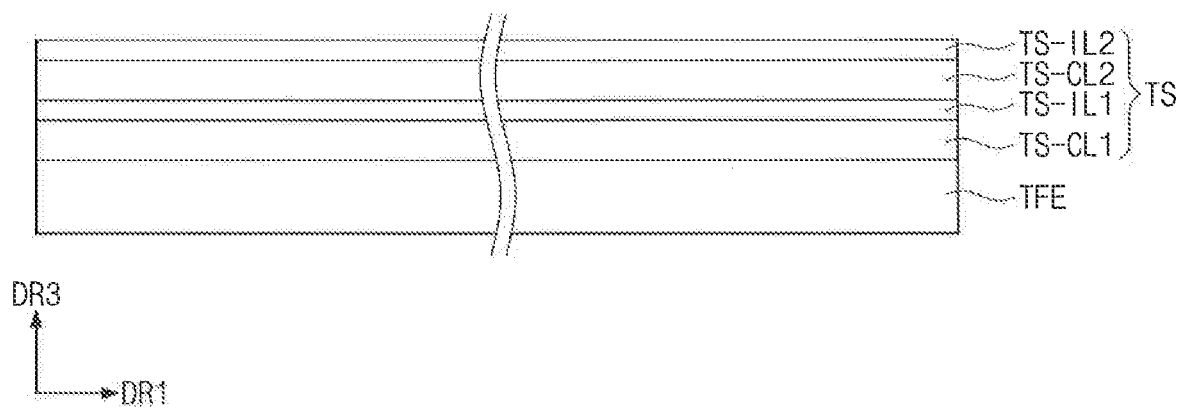
FIG. 7 is a cross-sectional view of the touch sensing unit shown in FIG. 6.

FIG. 6 is a plan view of a touch sensing unit TS according to an exemplary embodiment of the inventive concept, and FIG. 7 is a cross-sectional view of the touch sensing unit TS shown in FIG. 6.

Referring to FIG. 6, the touch sensing unit TS includes first conductive patterns and second conductive patterns. According to an embodiment of the inventive concept, the first conductive patterns may include first touch electrodes TE1-1 to TE1-5 and sensing signal lines SL1 to SL5 connected to the first touch electrodes TE1-1 to TE1-5. Each of the second conductive patterns may include second touch electrodes TE2-1 to TE2-4 and read-out lines RL1 to RL4 connected to the second touch electrodes TE2-1 to TE2-4.

Each of the first touch electrodes TE1-1 to TE1-5 may have a mesh form where a plurality of touch opening parts is defined. Each of the first touch electrodes TE1-1 to TE1-5 includes a plurality of first touch sensor parts SP1 and a plurality of first connection parts CP1. The first touch sensor parts SP1 are arranged along the second direction DR2. Each of the first connection parts CP1 connects adjacent two first touch sensor parts SP1 among the first touch sensor parts SP1.

The second touch electrodes TE2-1 to TE2-4 insulatingly intersect the first touch electrodes TE1-1 to TE1-5. Each of the second touch electrodes TE2-1 to TE2-4 may have a mesh form where a plurality of touch opening parts is defined. Each of the second touch electrodes TE2-1 to TE2-4 includes a plurality of second touch sensor parts SP2 and a plurality of second connection parts CP2. The second touch sensor parts SP2 are arranged along the first direction DR1. Each of the second connection parts CP2 connects adjacent two first touch sensor parts SP2 among the second touch sensor parts SP2.

The first touch electrodes TE1-1 to TE1-5 and the second touch electrodes TE2-1 to TE2-4 are capacitively coupled each other. As touch detection signals are applied to the first touch electrodes TE1-1 to TE1-5, capacitors are formed between the first touch sensor parts SP1 and the second touch sensor parts SP2.

The second driving circuit TDC may include a second shift register SR2 and a second control signal line CSL2. The second shift register SR2 includes a plurality of stages TSRC1 to TSRC5 arranged in a first direction DR1 and sequentially outputting a sensing signal. Each of the first touch electrodes TE1-1 to TE1-5 receives a sensing signal outputted from the plurality of stages TSRC1 to TSRC5.

The plurality of stages TSRC1 to TSRC5 may be connected in a one-to-one correspondence to the plurality of sensing signal lines SL1 to SL5. The plurality of sensing signal lines SL1 to SL5 are connected to one ends of the first touch electrodes TE1-1 to TE1-5, respectively. Accordingly, the sensing signals outputted from the plurality of stages TSRC1 to TSRC5 may be applied to the first touch electrodes TE1-1 to TE1-5 through the plurality of sensing signal lines SL1 to SL5.

The read-out lines RL1 to RL4 are connected to one ends of the second touch electrodes TE2-1 to TE2-4 to read out signals from the second touch electrodes TE2-1 to TE2-4. The display panel DP may further include touch pads TS-PD connected to the read-out lines RL1 to RL4. The touch pads TS-PD may be disposed in the pad area PDA shown in FIG. 3. The touch pads TS-PD are electrically connected to a touch detection circuit (not shown) for detecting a touch operation to transmit the read-out signal to the touch detection circuit. The touch detection circuit may detect whether each of the touch sensing parts SP1 and SP2 is touched based on the read-out signal.

Referring to FIG. 7, the touch sensing unit TS includes a first conductive layer TS-CL1, a first insulating layer TS-IL1 (hereinafter referred to as a first touch insulating layer), a second conductive layer TS-CL2, and a second insulating layer TS-IL2 (hereinafter referred to as a second touch insulating layer). The first conductive layer TS-CL1 is directly disposed on the thin film encapsulation layer TFE. The embodiments of the inventive concept is not limited thereto, and another inorganic layer or organic layer may be further disposed between the first conductive layer TS-CL1 and the thin film encapsulation layer TFE.

Portions of the plurality of first touch sensor parts SP1, the plurality of first connection parts CP1, the sensing signal lines SL1 to SL5, the plurality of second touch sensor parts SP2, the plurality of second connection parts CP2, and the read-out lines RL1 to RL4 may be formed by patterning the first conductive layer TS-CL1 shown in FIG. 7, and other portions may be formed by patterning the second conductive layer TS-CL2 shown in FIG. 7. In this embodiment, the plurality of first connection parts CP1 are formed from the first conductive layer TS-CL1, and the plurality of first touch sensor parts SP1, the sensing signal lines SL1 to SL5, the plurality of second touch sensor parts SP2, the plurality of second connection parts CP2, and the read-out lines RL1 to RL4 may be formed from the second conductive layer TS-CL2.

Moreover, the touch pads TS-PD may be included in the circuit element layer DP-CL of FIG. 2 as in the signal pads DP-PD shown in FIG. 3.

Although the touch detection unit TS where the plurality of first connection parts CP1 and the plurality of second connection parts CP2 cross each other is shown as an example, the inventive concept is not limited thereto. For example, each of the second connection parts CP2 may be modified to a V-shaped form so as not to overlap the plurality of first connection parts CP1. The V-shaped second connection parts CP2 may overlap the first touch sensor parts SP1. Although the first touch sensor parts SP1 and the second touch sensor parts SP2, each of which has a rhombus or triangular shape, are shown in this exemplary embodiment of the inventive concept, a person of ordinary skill in the art should understand and appreciate that the breadth of the embodiments of the inventive concept is not limited thereto.

Each of the first conductive layer TS-CL1 and the second conductive layer TS-CL2 may include a single layer structure or a multilayer structure stacked along the third direction axis DR3. A conductive layer of the multilayer structure may include at least two of transparent conductive layers and metal layers. A conductive layer of the multilayer structure may include metal layers with different metals. The transparent conductive layer may include indium tin oxide (ITO), indium zinc oxide (IZO), zinc oxide (ZnO), indium tin zinc oxide (ITZO), PEDOT, metal nano wire, and graphene. The metal layer may include silver, titanium, copper, aluminum, and an alloy thereof. For example, each of the first conductive layer TS-CL1 and the second conductive layer TS-CL2 may have a three-layer structure of titanium/aluminum/titanium.

Each of a first touch insulating layer TS-IL1 and a second touch insulating layer TS-IL2 may include an inorganic material or an organic material. At least one of the first touch insulating layer TS-IL1 and the second touch insulating layer TS-IL2 may include an inorganic layer. The inorganic layer may include a material of at least one of an aluminum, an oxide, a titanium oxide, a silicon oxide, a silicon oxynitride, a zirconium oxide, and a hafnium oxide.

At least one of the first touch insulating layer TS-IL1 and the second touch insulating layer TS-IL2 may include an organic layer. The organic layer may include at least one of acrylic resin, methacrylic resin, polyisoprene, vinyl resin, epoxy resin, urethane resin, cellulose resin, siloxane-based resin, polyimide-based resin, polyamide-based resin, and perylene resin. In this embodiment, the first touch insulating layer TS-IL1 is described as a touch inorganic layer and the second touch insulating layer TS-IL2 is described as a touch organic layer.

Figure 8:
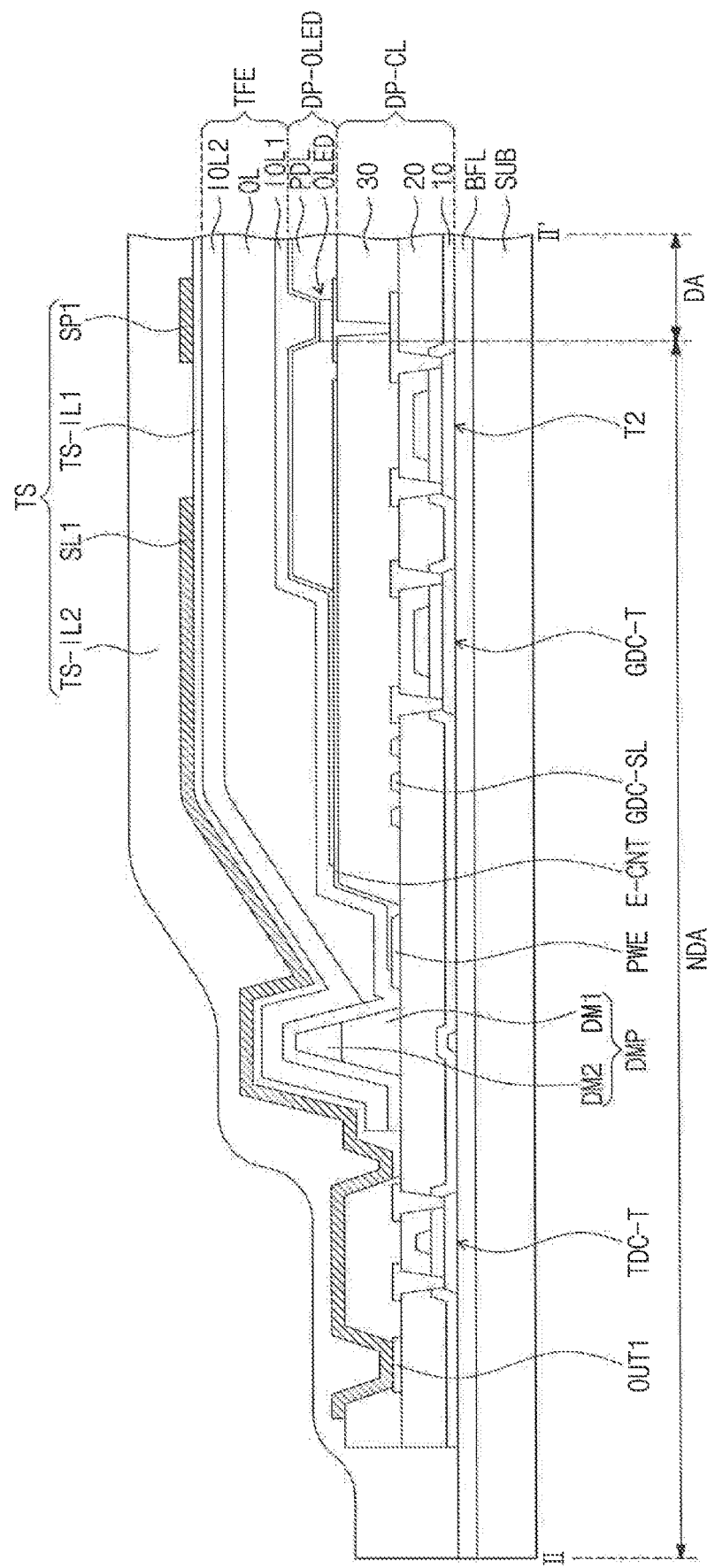
FIG. 8 is a cross-sectional view taken along a line II-II' shown in FIG. 6.

FIG. 8 is a cross-sectional view taken along a line II-II' shown in FIG. 6.

In FIG. 8, the lamination structure of the circuit element layer DP-CL, the display element layer DP-OLED, and the thin film encapsulation layer is the same as that described with reference to FIG. 5, and a detailed description thereof will be omitted.

As shown in FIGS. 6 and 8, the first and second driving circuits GDC and TDC constituting the circuit element layer DP-CL are disposed in the non-display area NDA. The first driving circuit GDC includes at least one transistor GDC-T formed through the same process as the transistor (hereinafter, referred to as a pixel transistor) of the pixel, for example, the first transistor (not shown) and the second transistor T2. The first driving circuit GDC may include signal lines GDC-SL disposed on the same layer as the input electrode of the pixel transistor T2. Although not separately shown, the first driving circuit GDC may further include a signal line disposed on the same layer as the control electrode of the pixel transistor T2.

The second driving circuit TDC includes at least one transistor TDC-T formed through the same process as the pixel transistor T2. The second driving circuit TDC may include signal lines (not shown) arranged on the same layer as the input and/or control electrodes of the pixel transistor T2.

Each of the stages TSRC1 to TSRC5 of the second driving circuit TDC may have an output terminal OUT1 for outputting a sensing signal. The output terminal OUT1 may be disposed on the same layer as the input electrode of the pixel transistor T2. However, embodiments of the inventive concept are not limited to this construction, and the output terminal OUT1 may be disposed on the same layer as the control electrode of the pixel transistor T2.

A power electrode PWE for providing the second power voltage ELVSS is disposed outside the first driving circuit GDC. The power electrode PWE may receive the second power voltage ELVSS from the outside. A connection electrode E-CNT is disposed on the intermediate organic layer 30. The connection electrode E-CNT connects the power electrode PWE and the second electrode CE. Since the connection electrode E-CNT is formed through the same process as the first electrode AE, it may include the same layer structure and the same material. The connection electrode E-CNT and the first electrode AE may have the same thickness.

One data line DL disposed on the second intermediate inorganic layer 20 is illustratively shown. A signal pad DP-PD is connected to the end of the data line DL.

The thin film encapsulation layer TFE includes a first encapsulation inorganic layer IOL1, a second encapsulation inorganic layer IOL2, and an encapsulation organic layer OL disposed between the first encapsulation inorganic film IOL1 and the second encapsulation inorganic film IOL2.

As shown in FIG. 8, a dam part DMP may have a multi-layer structure. A lower portion DM1 may be formed simultaneously with the intermediate organic layer 30, and an upper portion DM2 may be formed simultaneously with the pixel definition layer PDL. The dam part DMP prevents liquid organic substances from spreading out of the intermediate inorganic layers 10 and 20 during the process of forming the encapsulation organic layer OL. A liquid organic material, such as the encapsulation organic layer OL, is formed on the first encapsulation inorganic layer IOL1 by an ink jet method, and at this time, the dam part DMP sets the boundary of the area where the liquid organic material is disposed.

The first encapsulation inorganic layer IOL1 and the second encapsulation inorganic layer IOL2 may be arranged to overlap the dam part DMP. Since the encapsulation organic layer OL is disposed within the area defined by the dam part DMP, the first encapsulation inorganic layer IOL1 and the second encapsulation inorganic layer IOL2 may contact each other on the dam part DMP to form a seal with the encapsulation organic layer OL. The intermediate organic layer 30 and the dam part DMP are spaced apart from each other and no organic material is disposed in the area there between. The first encapsulation inorganic layer IOL1 may contact the second intermediate inorganic layer 20 in these intervening areas.

A touch inorganic layer TS-IL1 overlaps the dam part DMP. The touch inorganic layer TS-IL1 contacts the second intermediate inorganic layer 20 exposed from the intermediate organic layer 30, the first encapsulation inorganic layer IOL1, the second encapsulation inorganic layer IOL2 and the encapsulation organic layer OL.

As an example of the inventive concept, the sensing signal lines SL1 to SL5 and the touch sensor parts SP1 are formed above the touch inorganic layer TS-IL1. The sensing signal lines SL1 to SL5 may be electrically connected to the plurality of stages TSRC1 to TSRC5 of the second driving circuit TDC, respectively. Especially, as shown in FIG. 8, the first sensing signal line SL1 among the plurality of sensing signal lines SL1 to SL5 is connected to the output terminal OUT1 of the first stage TSRC1 of the plurality of stages TSRC1 to TSRC5.

The sensing signal lines SL1 to SL5 and the touch sensor units SP1 may be covered by a touch organic layer TS-IL2. In another exemplary embodiment of the inventive concept, the sensing signal lines SL1 to SL5 may be formed directly on the second encapsulation inorganic layer IOL2 and covered by the touch inorganic layer TS-IL1.

In FIG. 8, although a structure in which the circuit elements of the second driving circuit TDC are arranged outside the dam part is described, some circuit elements of the second driving circuit TDC may be arranged to overlap with the dam part DMP. However, a person of ordinary skill in the art should understand and appreciate that the output terminal OUT1 may be disposed outside the dam part DMP to easily form a contact structure for contacting the sensing signal lines SL1 to SL5.

As shown in FIGS. 1 to 8, the sensing signal lines SL1 to SL5 connected to the first touch electrodes TE1-1 to TE1-5 receive touch sensing signals through the second driving circuit TDC. Accordingly, the sensing signal lines SL1 to SL5 for supplying the touch sensing signals to the first touch electrodes TE1-1 to TE1-5 may not extend to the pad area PDA along the non-display area NDA. Therefore, it is possible to prevent the width (e.g., the bezel width) of the non-display area NDA from being increased due to the sensing signal lines SL1 to SL5. In addition, since the pads extending from the sensing signal lines SL1 to SL5 may not be provided in the pad area PDA, the width of the pad area PDA may be reduced.

Figure 9:
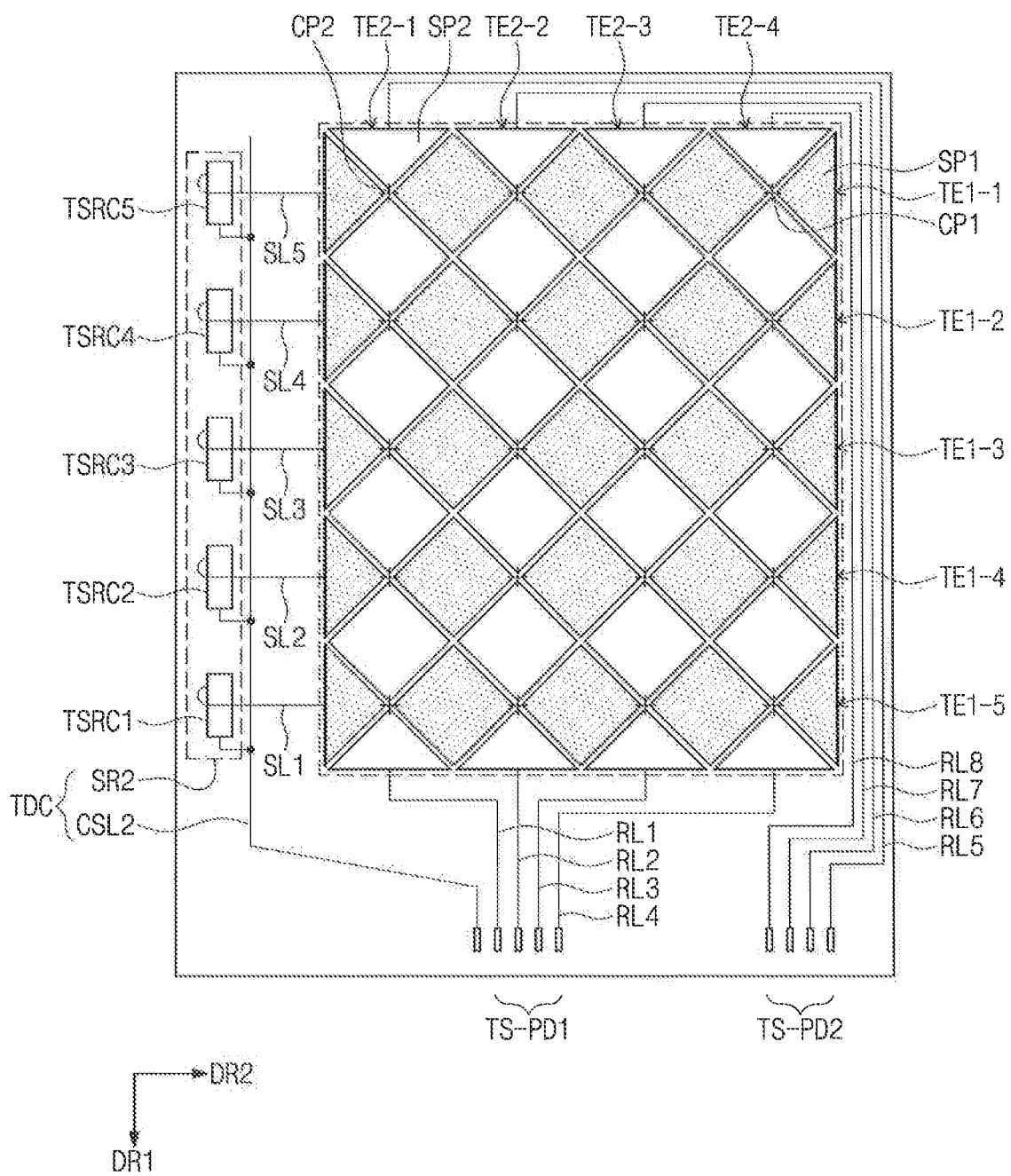
FIG. 9 is a plan view showing another exemplary embodiment of the touch sensing unit applied to the display device in FIG. 3.

FIG. 9 is a plan view showing another exemplary embodiment of the inventive concept in which a touch sensing unit TS applied to the display device DM in FIG. 3. However, the same reference numerals are used for components identical to the components shown in FIG. 6 among components shown in FIG. 9 and a detailed description thereof is redundant and thus will be omitted.

Referring to FIG. 9, the touch sensing unit TS may include first touch electrodes TE1-1 to TE1-5 and sensing signal lines SL1 to SL5 connected to the first touch electrodes TE1-1 to TE1-5, second touch electrodes TE2-1 to TE2-4 and first read-out lines RL1 to RL4 connected to one ends of the second touch electrodes TE2-1 to TE2-4, and second read-out lines RL5 to RL8 connected to the other ends of the second touch electrodes TE2-1 to TE2-4.

A pair of read-out lines is connected to both ends of the second touch electrodes TE2-1 to TE2-4. Therefore, in this case, signals of the second touch electrodes TE2-1 to TE2-4 may be read out at both ends.

Although not shown in the drawings, the sensing signal lines SL1 to SL5 may be also connected to both ends of the first touch electrodes TE1-1 to TE1-5 as another embodiment of the inventive concept.

The display panel DP includes first touch pads TS-PD1 connected to the first read-out lines RL1 to RL4 and second touch pads TS-PD2 connected to the second read-out lines RL5 to RL8. The first and second touch pads TS-PD1 and TS-PD2 may be disposed in the pad area PDA shown in FIG. 3. The first and second touch pads TS-PD1 and TS-PD2 may be electrically connected to a touch detection circuit (not shown) for sensing a touch operation, and may transmit the read-out signal to the touch detection circuit.

Figure 10:
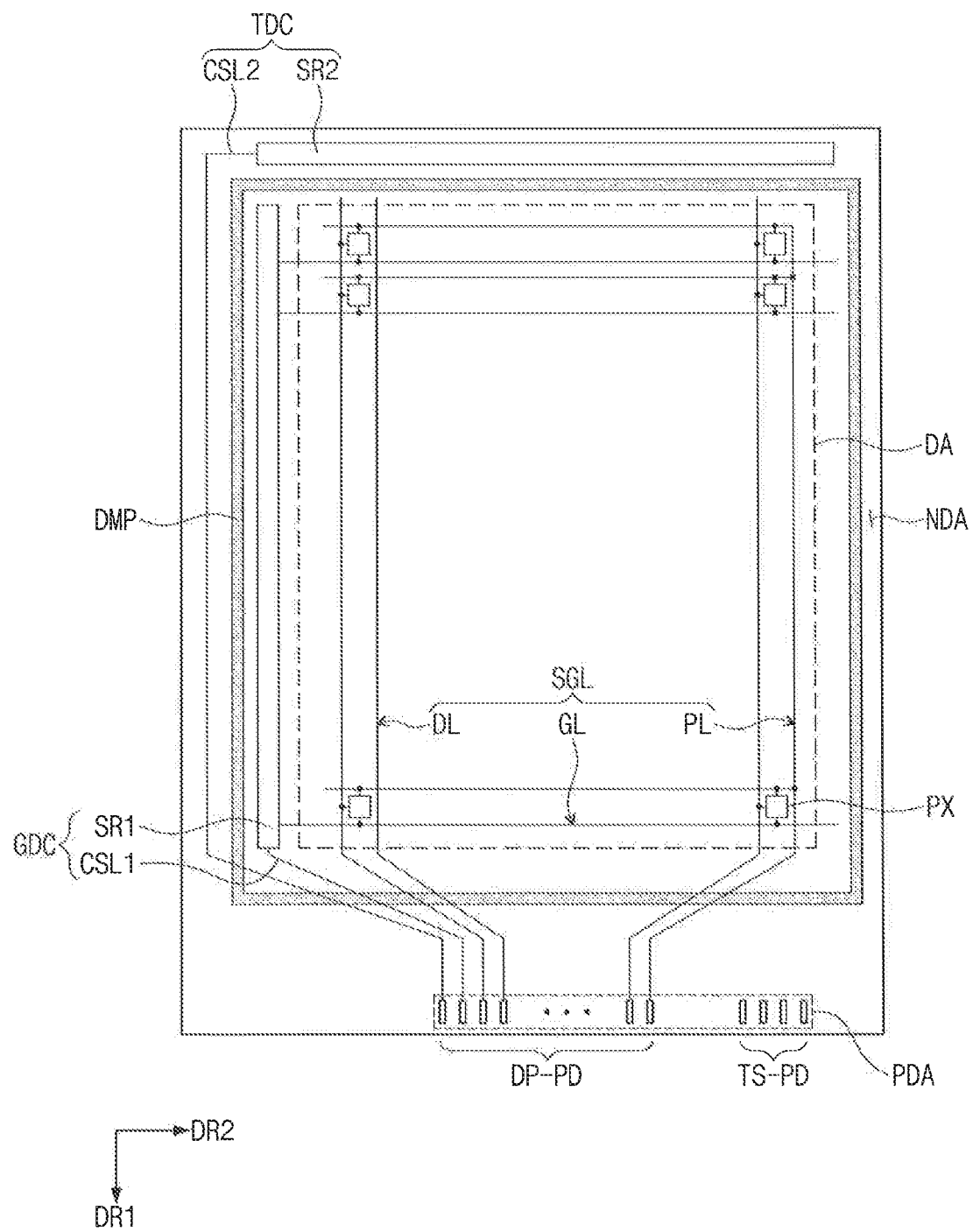
FIG. 10 is a plan view of a display device according to another exemplary embodiment of the inventive concept.
Figure 11:
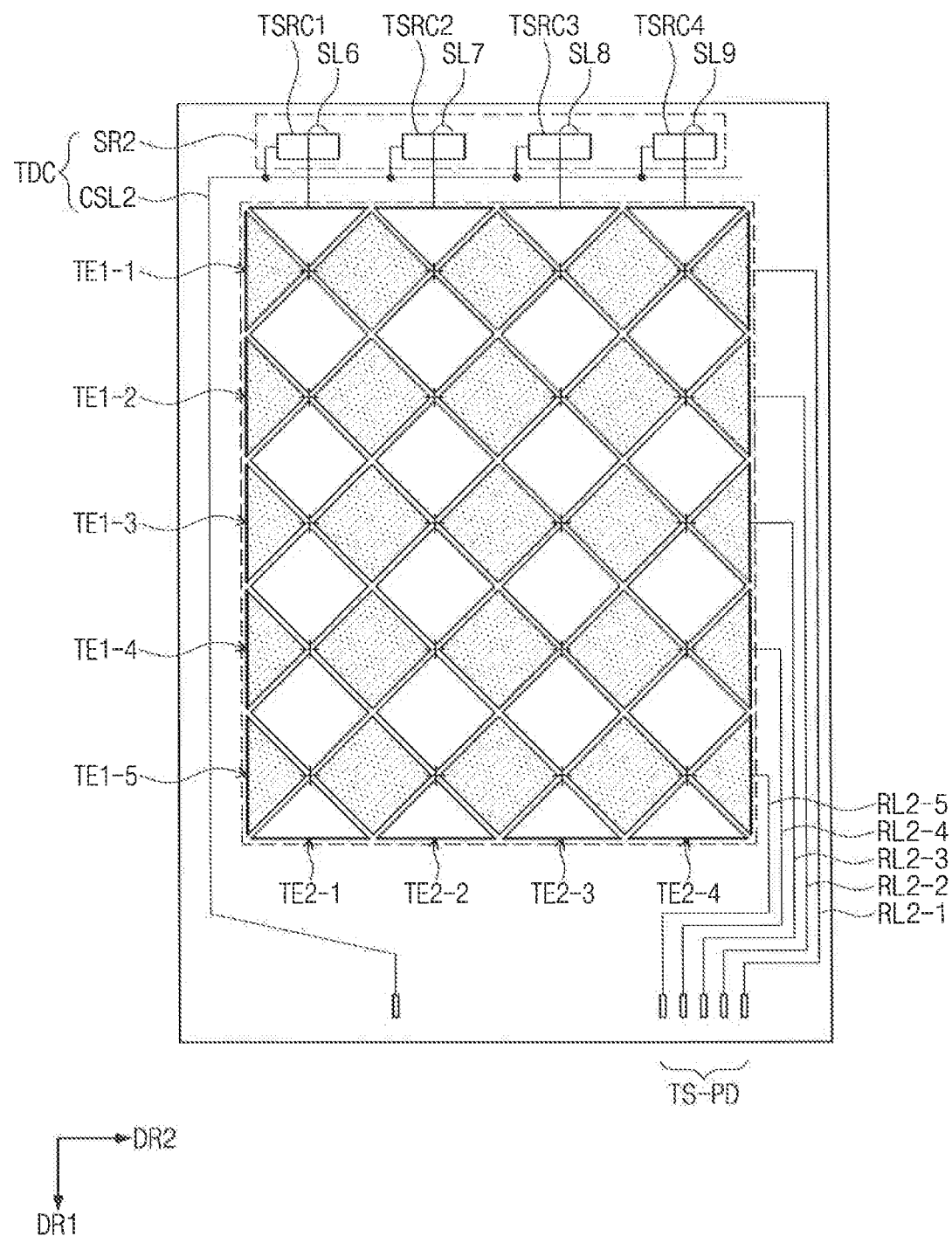
FIG. 11 is a plan view of a touch sensing unit applied to the display device in FIG. 10.

FIG. 10 is a plan view of a display device DM according to another exemplary embodiment of the inventive concept, and FIG. 11 is a plan view of a touch sensing unit TS applied to the display device shown in FIG. 10.

Referring to FIGS. 10 and 11, a display device DM according to another embodiment of the inventive concept includes a first driving circuit GDC and a second driving circuit TDC.

When the display area DA is formed in a rectangular shape defined by the first direction DR1 and the second direction DR2, the first driving circuit GDC is arranged adjacent to one side of two sides parallel to the first direction DR1 of the display area DA, and the second driving circuit TDC is arranged adjacent to one side of the two sides parallel to the second direction DR2 of the display area DA.

The first driving circuit GDC may include a first shift register SR1 and a first control signal line CSL1. The first shift register SR1 includes a plurality of stages, each of which generates a plurality of scan signals, and the plurality of stages is arranged in parallel with the first direction DR1. The second driving circuit TDC may include a second shift register SR2 and a second control signal line CSL2. The second shift register SR2 includes a plurality of stages TSRC1 to TSRC4 for generating a plurality of touch sensing signals respectively, and a plurality of stages TSRC1 to TSRC4 is arranged in parallel with the second direction DR2.

The plurality of stages TSRC1 to TSRC4 may be connected in a one-to-one correspondence to the plurality of sensing signal lines SL2 to SL4. The plurality of sensing signal lines SL2-1 to SL2-4 are connected to one ends of the second touch electrodes TE2-1 to TE2-4, respectively. Accordingly, the sensing signals outputted from the plurality of stages TSRC1 to TSRC4 may be applied to the second touch electrodes TE2-1 to TE2-4 through the plurality of sensing signal lines SL2-1 to SL2-4.

The read-out lines RL2-1 to RL2-5 are connected to one end of the first touch electrodes TE1-1 to TE1-5, and read out signals from the first touch electrodes TE1-1 to TE1-5. The display panel DP may further include touch pads TS-PD connected to the read-out lines RL2-1 to RL2-5. In another exemplary embodiment of the inventive concept, read-out lines (not shown) connected to one end of the first touch electrodes TE1-1 to TE1-5 to read out signals from the first touch electrodes TE1-1 to TE1-5 may be further provided.

The first driving circuit GDC is disposed inside a rectangular area defined by a dam part DMP and the second driving circuit TDC is disposed outside a square area defined by the dam part DMP. Although not shown in the drawing, a part of the second driving circuit TDC may overlap with the dam part DMP.

Figure 12:
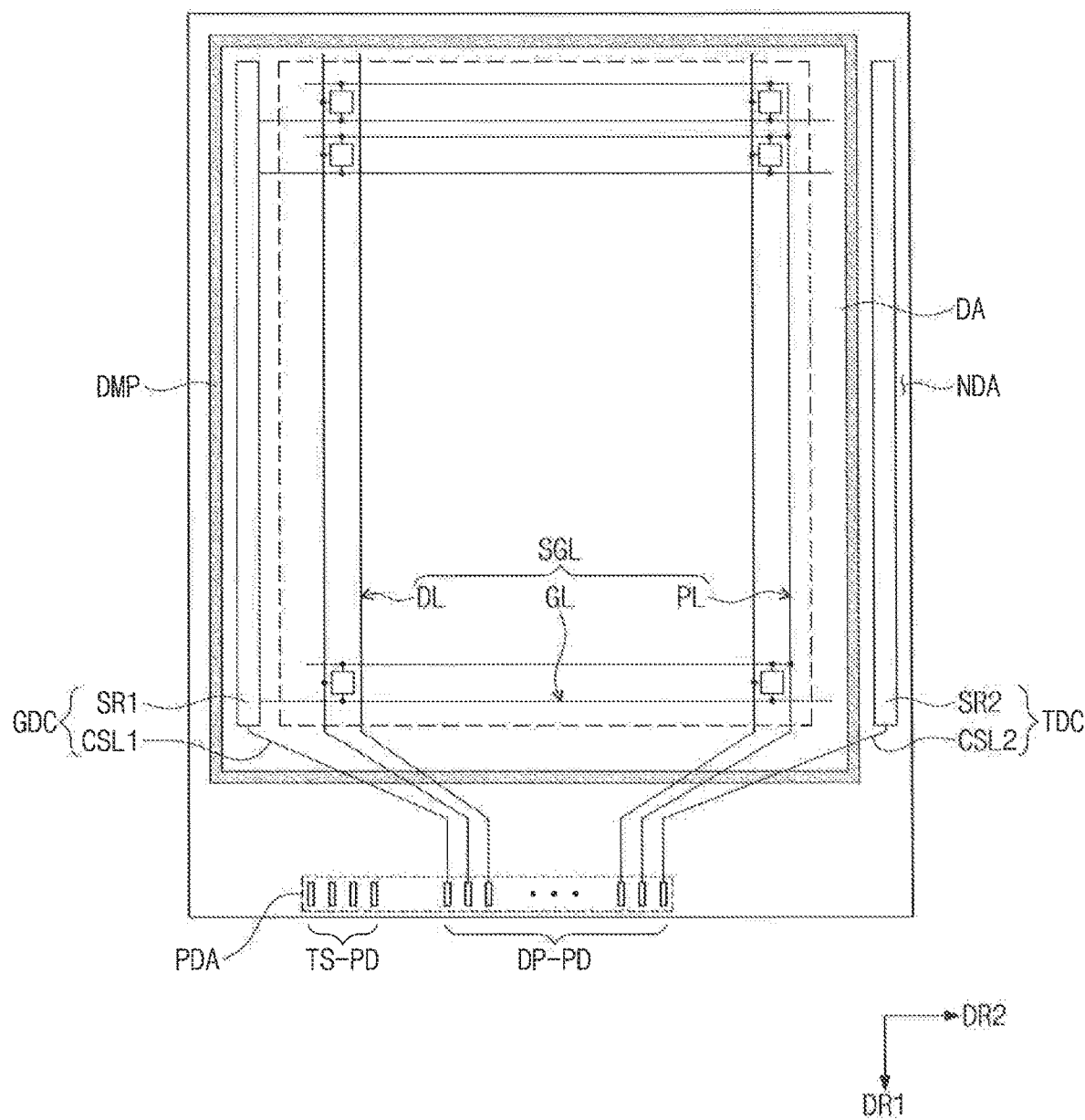
FIG. 12 is a plan view of a display device according to another exemplary embodiment of the inventive concept.

FIG. 12 is a plan view of a display device DM according to another exemplary embodiment of the inventive concept.

Referring to FIG. 12, in a display device DM according to another exemplary embodiment of the inventive concept, the first driving circuit GDC is arranged adjacent to one side of two sides parallel to the first direction DR1 of the display area DA, and the second driving circuit TDC is arranged adjacent to the other side of the two sides parallel to the first direction DR1 of the display area DA.

The first driving circuit GDC may include a first shift register SR1 and a first control signal line CSL1. The first shift register SR1 includes a plurality of stages, each of which generates a plurality of scan signals, and the plurality of stages is arranged in parallel with the first direction DR1. The second driving circuit TDC may include a second shift register SR2 and a second control signal line CSL2. The second shift register SR2 includes a plurality of stages, each of which generates a plurality of touch sensing signals, and the plurality of stages is arranged in parallel with the first direction DR1.

The first driving circuit GDC is disposed inside a rectangular area defined by the dam part DMP and the second driving circuit TDC is disposed outside a square area defined by the dam part DMP. Although not shown in the drawing, a part of the second driving circuit TDC may overlap with the dam part DMP.

Figure 13:
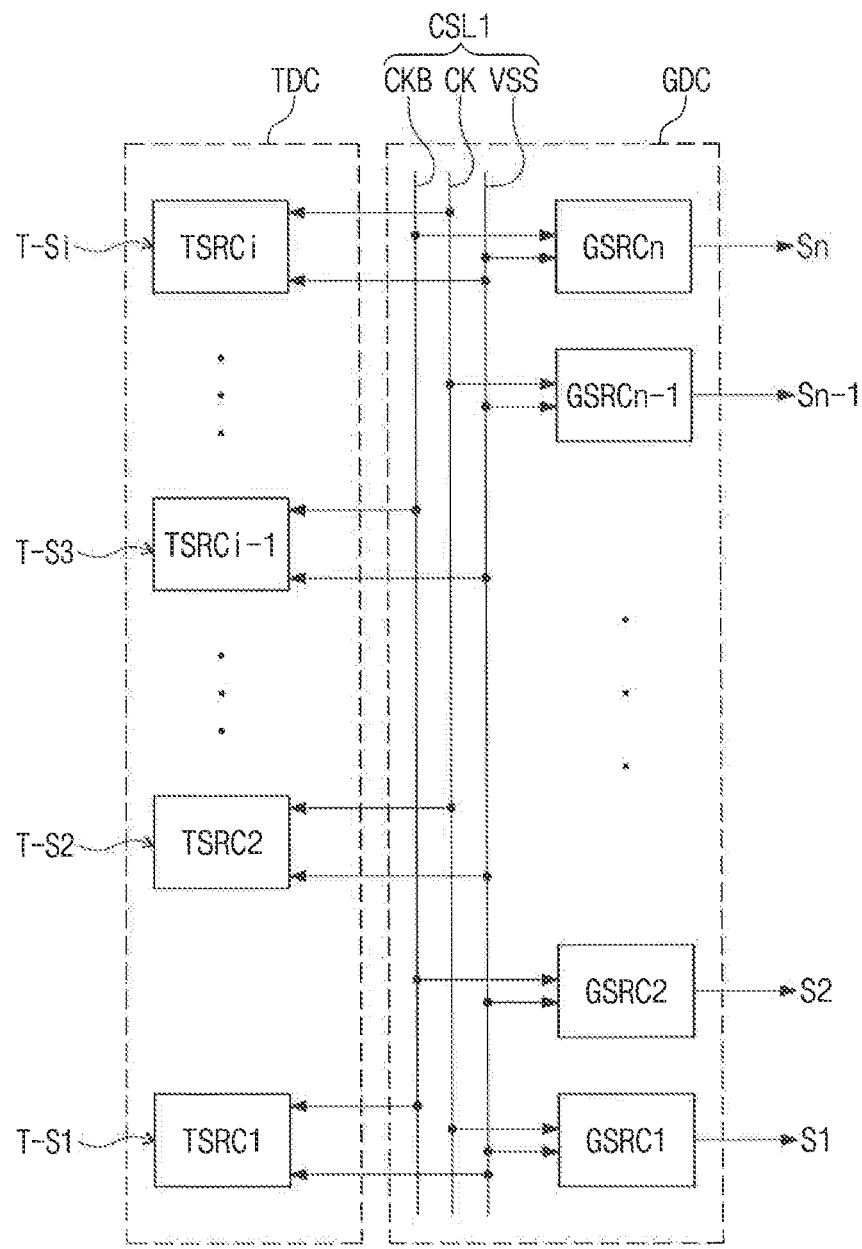
FIG. 13 is a block diagram illustrating first and second driving circuits according to another exemplary embodiment of the inventive concept.
Figure 14:
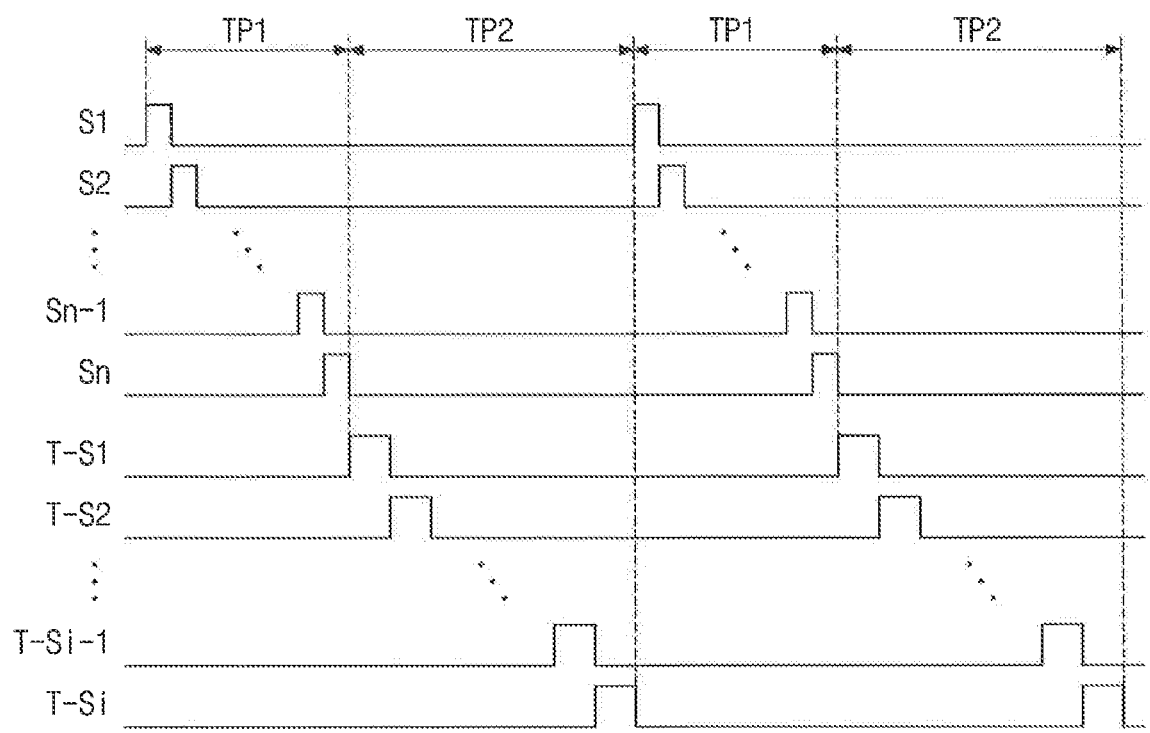
FIG. 14 is a waveform diagram illustrating operations of the first and second driving circuits shown in FIG. 13.

FIG. 13 is a block diagram illustrating first and second driving circuits according to another exemplary embodiment of the inventive concept, and FIG. 14 is a waveform diagram illustrating operations of first and second driving circuits shown in FIG. 13.

Referring to FIG. 13, the first driving circuit GDC may include a first shift register SR1 and a first control signal line CSL1. The first shift register SR1 includes a plurality of stages GSRC1 to GSRCn for generating a plurality of scan signals, respectively. The first control signal line CSL1 may include a clock signal line CK, a clock bar signal line CKB, and an off voltage line VSS.

The odd-numbered stages GSRC1 to GSRCn-1 of the plurality of stages GSRC1 to GSRCn receive the first clock signal through the clock signal line CK, and the even-numbered stages GSRC2 to GSRCn receive the first clock bar signal through the clock bar signal line CKB. In another exemplary embodiment of the inventive concept, each of the plurality of stages GSRC1 to GSRCn may be connected to the clock signal line CK and the clock bar signal line CKB to receive the first clock signal and the first clock bar signal. Each of the plurality of stages GSRC1 to GSRCn receives an off voltage through an off voltage line VSS.

The second driving circuit TDC may include a second shift register SR2. The second shift register SR2 includes a plurality of stages TSRC1 to TSRCi for generating a plurality of touch sensing signals T-S1 to T-Si, respectively. The number of stages constituting the second shift register SR2 may be smaller than the number of stages constituting the first shift register SR1.

The plurality of stages TSRC1 to TSRCi may receive the second control signal through the first control signal line CSL1. That is, the first shift register SR1 and the second shift register SR2 share the first control signal line CSL1, and the first shift register SR1 and the second shift register SR2 may operate alternately. While the first shift register SR1 is operating, the first control signal line CSL1 supplies the first control signal to the first shift register SR1, and during this period, the second shift register SR2 is turned off. While the first shift register SR1 is operating, the first control signal line CSL1 supplies the first control signal to the first shift register SR1, and during this period, the second shift register SR2 is turned off.

Although not shown in the drawing, a signal for controlling the first and second shift registers SR1 and SR2 to be turned on and off alternately as in the above may be inputted to the first and second shift registers SR1 and SR2.

The odd-numbered stages TSRC1 to TSRCi-1 of the plurality of stages TSRC1 to TSRCi receive the second clock signal through the clock signal line CK and the even-numbered stages TSRC2 to TSRCi receive the second clock bar signal through the clock bar signal line CKB. The second clock signal may have a lower frequency than the first clock signal and the second clock bar signal may have a lower frequency than the first clock bar signal.

In another exemplary embodiment, each of the plurality of stages TSRC1 to TSRCn may be connected to the clock signal line CK and the clock bar signal line CKB to receive the second clock signal and the second clock bar signal. Each of the plurality of stages TSRC1 to TSRCi receives an off voltage through an off voltage line VSS. As an example of the inventive concept, the first and second shift registers SR1 and SR2 receive the same off voltage, but in other embodiments, the first and second shift registers SR1 and SR2 may receive off voltages of different sizes.

As shown in FIG. 14, the plurality of stages GSRC1 to GSRCn operate during a first scan section TP1 to sequentially output the scan signals S1 to Sn. The plurality of stages TSRC1 to TSRCi operate during a second scan section TP2 to sequentially output the touch sensing signals T-S1 to T-Si.

When the display device DM operates in the simultaneous light emission mode, the second scan section TP2 may be a section (e.g., a light emission section) where the organic light emitting diodes OLED (see FIG. 4) of the display element layer DP-OLED (see FIG. 2) emit light simultaneously. During the light emission section in the simultaneous light emission mode, the first shift register SR1 does not output the scan signals and is turned off. The second shift register SR2 may operate by receiving the second control signal using the first control signal line CSL1 during the light emitting section where the first shift register SR1 is not operated.

Accordingly, since the first and second shift registers SR1 and SR2 operate by sharing the first control signal line CSL1, there may not be provided an additional line for supplying the second control signal to the second shift register SR2, thereby preventing the width of the non-display area NDA (see FIG. 6) from expanding.

Figure 15:
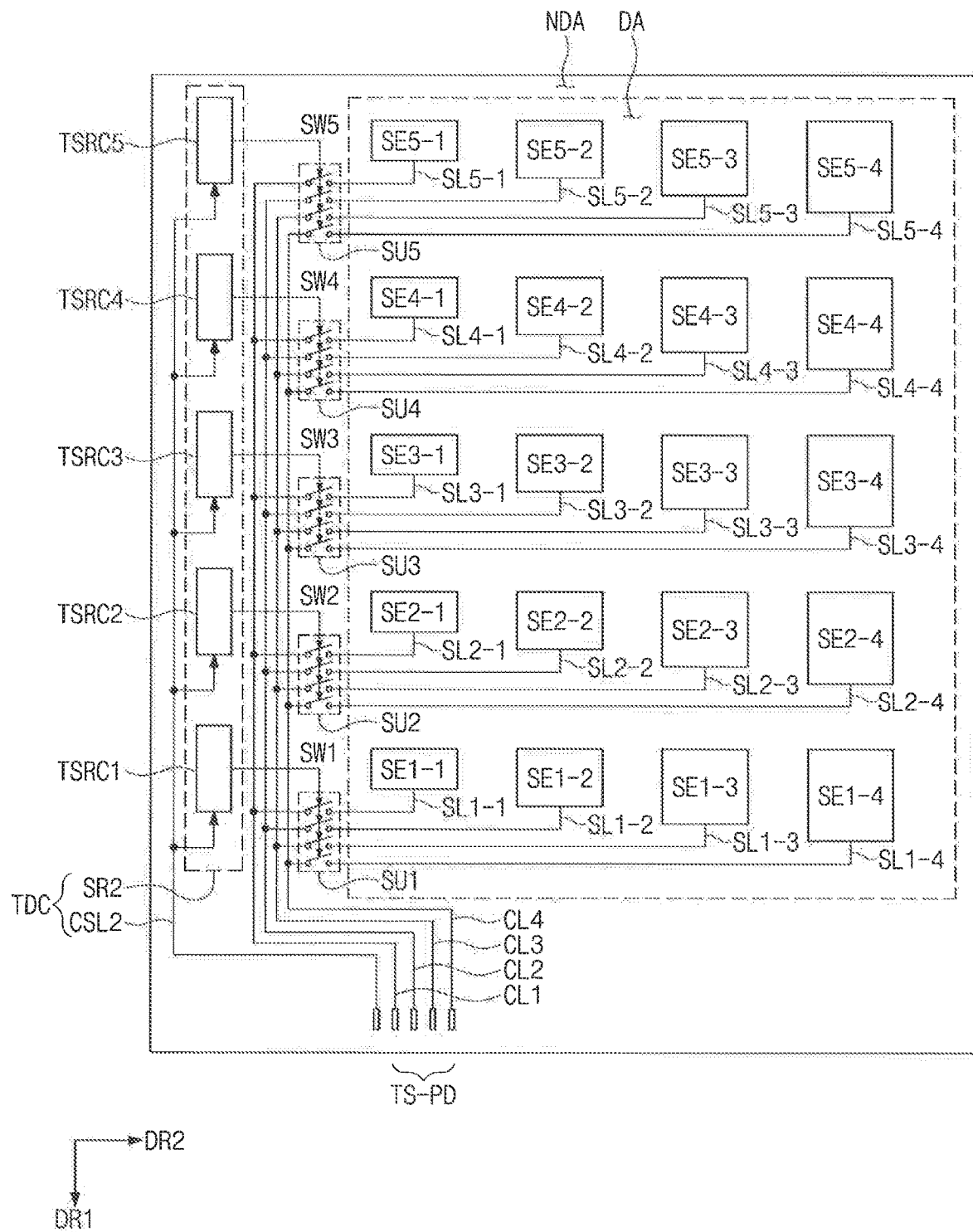
FIG. 15 is a plan view of a touch sensing unit according to another exemplary embodiment of the inventive concept.
Figure 16:
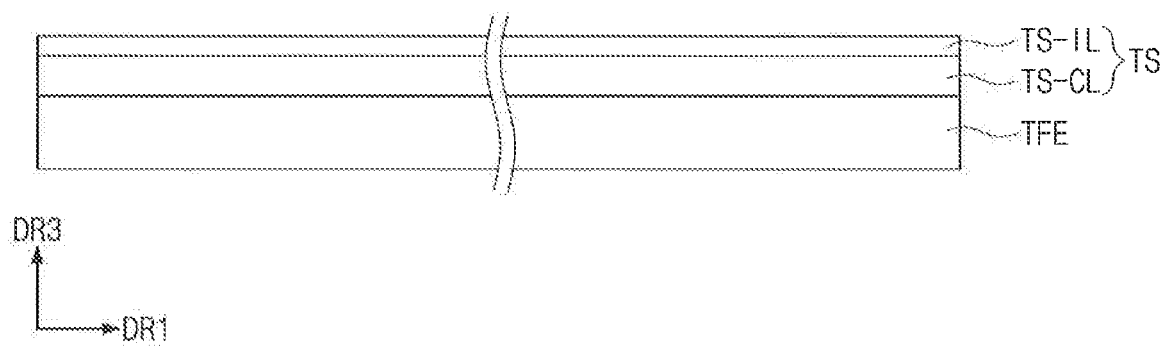
FIG. 16 is a cross-sectional view of the touch sensing unit shown in FIG. 15.
Figure 17:
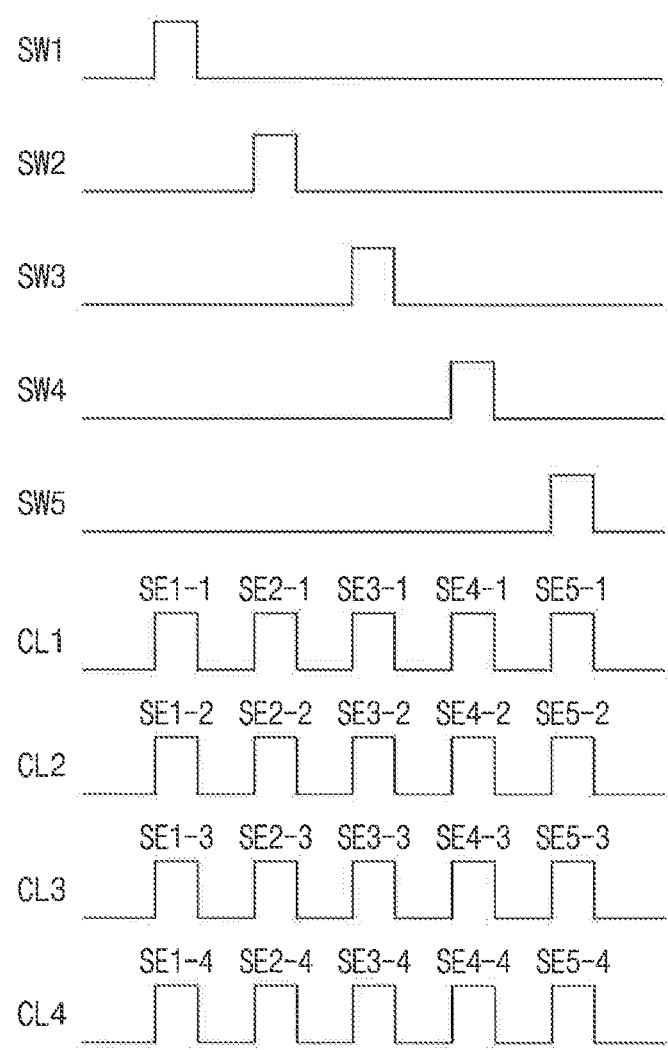
FIG. 17 is a waveform diagram illustrating operations of the second driving circuit and the touch sensing unit in FIG. 15.

FIG. 15 is a plan view of a touch sensing unit according to another exemplary embodiment of the inventive concept. FIG. 16 is a cross-sectional view of a touch sensing unit shown in FIG. 15. FIG. 17 is a waveform diagram illustrating operations of a second driving circuit and a touch sensing unit shown in FIG. 15.

Referring to FIGS. 15 and 16, a touch sensing unit TS according to another embodiment of the inventive concept includes a single-layer type touch sensing unit including a conductive layer TS-CL and an insulating layer TS-IL (or a touch insulating layer). The single-layer touch detection unit may obtain coordinate information through a self-cap method.

The conductive layer TS-CL may have a single-layer structure or may have a multilayer structure stacked along the third direction DR3. A conductive layer of the multilayer structure may include at least two of transparent conductive layers and metal layers. The conductive layer TS-CL includes a plurality of patterns such as the touch electrodes SE1-1 to SE5-4 and the touch signal lines SL1-1 to SL5-4. The touch insulating layer TS-IL includes at least an inorganic layer. The touch insulating layer may further include an organic layer.

The touch sensing unit TS includes the touch electrodes SE1-1 to SE5-4 and the touch signal lines SL1-1 to SL5-4 arranged apart from each other. The touch electrodes SE1-1 to SE5-4 may be arranged in a matrix form and connected to the touch signal lines SL1-1 to SL5-4, respectively. As an example of the inventive concept, four touch electrodes are arranged in the second direction DR2, and five touch electrodes are arranged in each row in the first direction DR1 so that the touch electrodes SE1-1 to SE5-4 are arranged in a matrix of 4 columns×5 rows. However, the shapes and arrangement of the touch electrodes SE1-1 to SE5-4 are not particularly limited. Some of the touch signal lines SL1-1 to SL5-4 may be disposed in the display area DA and some of them may be disposed in the non-display area NDA.

The touch sensing unit TS may further include common signal lines CL1 to CL4 connected to one ends of the touch signal lines SL1-1 to SL5-4 arranged in the non-display area NDA. The common signal lines CL1 to CL4 may be disposed in the non-display area NDA. The common signal lines CL1 to CL4 may be connected to the four touch signal lines drawn from the touch electrodes of each row through the respective switch units.

Specifically, the first switch unit SU1 switches the connection of the first to fourth common signal lines CL1 to CL4 and the first to fourth touch signal lines SL1-1 to SL1-4. The second switch unit SU2 switches the connection of the first to fourth common signal lines CL1 to CL4 and the fifth to eighth touch signal lines SL2-1 to SL2-4. The third switch unit SU3 switches the connection of the first to fourth common signal lines CL1 to CL4 and the ninth to twelfth touch signal lines SL3-1 to SL3-4. The fourth switch unit SU4 switches the connection of the first to fourth common signal lines CL1 to CL4 and the 13th to the 16th touch signal lines SL4-1 to SL4-4. The fifth switch unit SU5 switches the connection of the first to fourth common signal lines CL1 to CL4 and the 17th to 20th touch signal lines SL5-1 to SL5-4.

The second driving circuit TDC may include a second shift register SR2 and a second control signal line CSL2. The second shift register SR2 includes a plurality of stages TSRC1 to TSRC5 for generating a plurality of switching signals SW1 to SW5 (hereinafter, referred to as first to fifth switching signals), respectively. The plurality of switching signals SW1 to SW5 may be sequentially outputted and supplied to the first to fifth switch units SU1 to SU5. Accordingly, the first to fifth switch units SU1 to SU5 may be sequentially turned on in response to the first to fifth switching signals SW1 to SW5.

As shown in FIGS. 15 and 17, when the first switch unit SU1 operates in response to the first switching signal SW1, the first to fourth common signal lines CL1 to CL4 are electrically connected to the first to fourth touch signal lines SL1-1 to SL1-4. During the operation section of the first switch unit SU1, the second to fifth switch units SU2 to SU5 are turned off so that the other touch signal lines are electrically separated from the first to fourth common signal lines CL1 to CL4. In addition, the signals inputted to and outputted from the first to fourth touch electrodes SE1-1 to SE1-4 during the operation section of the first switch unit SU1 may pass through the first to fourth common signal lines CL1 to CL4.

Then, when the second switch unit SU2 operates in response to the second switching signal SW2, the first to fourth common signal lines CL1 to CL4 are electrically connected to the fifth to eighth touch signal lines SL2-1 to SL2-4. In such a way, by controlling the first to fifth switch units SU1 to SU5 to operate sequentially through the second driving circuit TDC, the first to fourth common signal lines CL1 to CL4 may be shared to supply signals to 20 touch electrodes SE1-1 to SE5-4 or to read out the signals from the 20 touch electrodes SE1-1 to SE5-4.

In another embodiment of the inventive concept, when the signal is supplied to the touch signal lines SL1-1 to SL5-4, as the first to fifth switching units SU1 to SU5 are turned on at the same time, signals may be simultaneously supplied to the touch electrodes SE1-1 to SE5-4. On the other hand, only when the signal is read out from the touch electrodes SE1-1 to SE5-4, the second driving circuit TDC is used to sequentially turn on the first to fifth switching units SU1 to SU5 so that the signal may be read out by each row unit.

As shown in FIG. 15 to FIG. 17, by using the second driving circuit TDC in the self-capping scheme, the touch signal lines SL1-1 to SL5-4 may not extend to the pad area PDA (see FIG. 3) along the non-display area NDA. Therefore, it is possible to prevent the width of the non-display area from increasing due to the touch signal lines SL1-1 to SL5-4. In addition, since it is not necessary to provide the pads corresponding to the number of the touch signal lines SL1-1 to SL5-4, the width of the pad area PDA (see FIG. 3) may be reduced.

In relation to the display device according to an embodiment of the inventive concept, the sensing signal lines receive touch sensing signals through the second driving circuit, and thus the sensing signal lines may not extend to the pad area along the non-display area of the display panel. Accordingly, it is possible to prevent an increase in the width (e.g., the bezel width) of the non-display area due to an arrangement of the sensing signal lines along the non-display area of the display panel.

In addition, since the pads extending from the sensing signal lines may not to be provided in the pad area, the width of the pad area may be reduced.

Although some of the exemplary embodiments of the inventive concept have been shown and described herein, it is understood that the inventive concept is not be limited to the exemplary embodiments herein, and that various changes and modifications can be made by one ordinary skilled in the art within the spirit and scope of the inventive concept as hereinafter claimed.

What is claimed is:
1. A display device comprising:
   a base layer comprising a display area and a non-display area bordering at least a portion of the display area;
   a circuit element layer comprising a first driving circuit and a second driving circuit disposed in the non-display area of the base layer, and a pixel driving circuit disposed in the display area of the base layer and configured to receive a driving signal from the first driving circuit;
   a display element layer disposed in the display area of the base layer and including display elements provided on the circuit element layer;
   a thin film encapsulation layer that covers the display element layer in the display area and covers the first driving circuit and the second driving circuit in the non-display area; and
   a touch sensing layer comprising a plurality of sensing signal lines and a plurality of touch electrodes, the sensing signal lines are configured to provide a touch sensing signal from the second driving circuit to the touch electrodes,
   wherein the first driving circuit is connected to the pixel driving circuit but not the touch electrodes, the first driving circuit is disposed between the display area and the second driving circuit in the non-display area, the sensing signal lines are disposed in the non-display area to be in contact with the second driving circuit, and the first driving circuit is electrically separate from the second driving circuit, wherein the second driving circuit comprises at least one transistor and a plurality of output terminals that are formed on the base layer, and the sensing signal lines are is in direct contact with the output terminals of the second driving circuit without passing through a pad in the non-display area, wherein the second driving circuit comprises:

a shift register configured to sequentially output the touch sensing signal; and a second control signal line for supplying a second control signal to control the shift register, wherein contact portions of the output terminals and the sensing signal lines are disposed outside contact portions of the second control signal line and the shift register.

2. The display device of claim 1, wherein the plurality of touch electrodes comprises:

a plurality of first touch electrodes arranged in a first direction; and a plurality of second touch electrodes arranged in a second direction substantially perpendicular to the first direction.

3. The display device of claim 2, wherein the shift register comprises a plurality of stages arranged in a first direction and sequentially driven in the first direction, and the plurality of stages is connected to the plurality of sensing signal lines, respectively.

4. The display device of claim 2, wherein the touch sensing layer further comprises a plurality of read-out lines connected to first ends of the second touch electrodes, respectively, to read out signals from the second touch electrodes.

5. The display device of claim 4, wherein the plurality of read-out lines comprises:

first read-out lines connected to first ends of the second touch electrodes, respectively, to read out signals from the second touch electrodes; and second read-out lines connected to second ends of the second touch electrodes, respectively, to read out the signals from the second touch electrodes.

6. The display device of claim 2, further comprising:

a dam part formed in a closed loop shape that surrounds the display area, wherein the display area has a substantially rectangular shape defined by the first direction and the second direction, and the dam part is formed in a rectangular closed loop shape.

7. The display device of claim 6, wherein a portion of the second driving circuit overlaps the dam part.

8. The display device of claim 2, wherein the first driving circuit and the second driving circuit are both disposed in the non-display area of the base layer substantially parallel to the first direction.

9. The display device of claim 2, wherein the first driving circuit is provided substantially parallel to the first direction, and the second driving circuit is provided substantially parallel to the second direction.

10. A display device comprising:

a base layer comprising a display area and a non-display area bordering at least a portion of the display area;

a circuit element layer comprising a first driving circuit and a second driving circuit disposed in the non-display area of the base layer, and a pixel driving circuit disposed in the display area of the base layer and configured to receive a driving signal from the first driving circuit;

a display element layer disposed in the display area of the base layer and including display elements provided on the circuit element layer;

a thin film encapsulation layer that covers the display element layer in the display area and covers the first driving circuit and the second driving circuit in the non-display area; and a touch sensing layer comprising a plurality of sensing signal lines and a plurality of touch electrodes the sensing signal lines are configured to provide a touch sensing signal from the second driving circuit to the touch electrodes, wherein the second driving circuit includes a second shift register configured to sequentially output the touch sensing signal, the first driving circuit comprises:

a first shift register configured to sequentially output and supply scan signals to the pixel driving circuit; and a first control signal line configured to supply a first control signal to drive the first shift register, wherein the second shift register is connected to the first control signal line, the second shift register receives a second control signal that controls the second shift register through the first control signal line, and wherein the first shift register and the second shift register operate alternately, wherein the first driving circuit is disposed between the display area and the second driving circuit in the non-display area, and the sensing signal lines are disposed in the non-display area to be in contact with the second driving circuit, wherein the second driving circuit comprises at least one transistor and a plurality of output terminals that are formed on the base layer, and the sensing signal lines are in direct contact with the output terminals of the second driving circuit without passing through a pad in the non-display area, wherein contact portions of the output terminals and the sensing signal lines are disposed outside contact portions of the first control signal line and the second shift register.

* * * * *